(12) United States Patent
Sashida

(10) Patent No.: US 6,872,617 B2
(45) Date of Patent: Mar. 29, 2005

(54) SEMICONDUCTOR DEVICE MANUFACTURING METHOD

(75) Inventor: Naoya Sashida, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/388,455

(22) Filed: Mar. 17, 2003

(65) Prior Publication Data
US 2004/0043517 A1 Mar. 4, 2004

(30) Foreign Application Priority Data
Aug. 28, 2002 (JP) .............. 2002-249628

(51) Int. Cl.$^7$ .............................. H01L 21/8242
(52) U.S. Cl. ................................ 438/240; 438/958
(58) Field of Search ................ 438/3, 240, 763, 438/789, 909, 935, 958

(56) References Cited

U.S. PATENT DOCUMENTS

| | | | |
|---|---|---|---|
| 5,624,864 A | 4/1997 | Arita et al. | 438/958 |
| 5,795,821 A * | 8/1998 | Bacchetta et al. | 438/958 |
| 6,162,723 A * | 12/2000 | Tanaka | 438/788 |
| 6,432,845 B1 * | 8/2002 | Morozumi | 438/789 |
| 2001/0023080 A1 | 9/2001 | Koo | 438/3 |
| 2002/0061620 A1 * | 5/2002 | Hikosaka et al. | 438/240 |

FOREIGN PATENT DOCUMENTS

| | | |
|---|---|---|
| EP | 1 061 573 A2 | 12/2000 |
| JP | 7-263637 | 10/1995 |
| JP | 11-330390 | 11/1999 |
| JP | 2001-60669 | 3/2001 |

* cited by examiner

Primary Examiner—Chandra Chaudhari
(74) Attorney, Agent, or Firm—Westerman, Hattori, Daniels & Adrian, LLP

(57) ABSTRACT

There are provided the steps of forming a first insulating film over a semiconductor substrate, forming a capacitor having a lower electrode, a ferroelectric layer, and an upper electrode over the first insulating film, and growing a second insulating film over the first insulating film and the capacitor by using a mixed gas containing a compound gas of oxygen and nitrogen, TEOS, and oxygen. Accordingly, characteristics of the capacitor can be improved irrespective of the capacitor forming position on the insulating layer.

19 Claims, 17 Drawing Sheets

A: present invention
B: prior art

A: present invention
B: prior art

SEMICONDUCTOR DEVICE MANUFACTURING METHOD

CROSS-REFERENCE TO RELATED APPLICATIONS

This application is based upon and claims priority of Japanese Patent Application No. 2002-249628, filed on Aug. 28, 2002, the contents being incorporated herein by reference.

BACKGROUND OF THE INVENTION

1. Field of the Invention

The present invention relates to a semiconductor device manufacturing method and, more particularly, a method of manufacturing a semiconductor device having a capacitor.

2. Description of the Prior Art

As the nonvolatile memory that can still store the information after the power supply is turned OFF, the flash memory and the ferroelectric memory (FeRAM) are well known.

The flash memory has the floating gate that is buried in the gate insulating film of the insulated-gate field effect transistor (IGFET), and stores the information by accumulating charges as the stored information into the floating gate. The tunnel current must be supplied to the gate insulating film to write/erase the information, and thus the relatively high voltage is required.

The FeRAM has the ferroelectric capacitor that stores the information by utilizing the hysteresis characteristic of the ferroelectric substance. The ferroelectric film, which is formed between the upper electrode and the lower electrode in the ferroelectric capacitor, generates the polarization in reply to the voltage value applied between the upper electrode and the lower electrode, and has the spontaneous polarization that holds the polarization after the applied voltage is removed. If the polarity of the applied voltage is inverted, the polarity of the spontaneous polarization is also inverted. The information can be read by sensing the polarization and the magnitude of this spontaneous,polarization.

The FeRAM has such a merit that it can operate at a lower voltage than the flash memory and thus the high-speed writing can be executed in a power saving mode.

The memory cell of the FeRAM has a structure shown in FIG. 1 and FIG. 2, for example. FIG. 1 is a plan view showing a part of the memory cell area of the FeRAM, wherein insulating layers other than an element isolation insulating layer are omitted from illustration. FIG. 2 is a sectional view taken along a I—I line in FIG. 1.

In FIG. 1, a well region 103 that is surrounded with an element isolation insulating layer 102 is formed on a silicon substrate 101. Then, MOS transistors 107a, 107b having sectional structures, as shown in FIG. 2, are formed in the well region 103. Then, planar capacitors 100 having sectional structures, as shown in FIG. 2, are formed on the obliquely upper of the well region 103.

In FIG. 2, two gate electrodes 105a, 105b are formed over the well region 103, which is surrounded with the element isolation insulating layer 102, of the silicon substrate 101 via a gate insulating film 104. Also, impurity diffusion regions 106a, 106b, 106c each having the LDD structure are formed in the well region 103 on both sides of respective gate electrodes 105a, 105b. The first MOS transistor 107a consists of one gate electrode 105a, the impurity diffusion regions 106a, 106b, etc. Also, the second MOS transistor 107b consists of the other gate electrode 105b, the impurity diffusion regions 106b, 106c, etc.

The element isolation insulating layer 102 and the MOS transistors 107a, 107b are covered with first and second insulating layers 108, 109. The first insulating layer 108 is made of the material that functions as an oxidation preventing layer. An upper surface of the second insulating layer 109 is planarized by the chemical mechanical polishing (CMP) method. The ferroelectric capacitor 100 is formed on the upper surface of the second insulating layer 109.

The ferroelectric capacitor 100 has a lower electrode 100a having a contact region, a ferroelectric layer 100b, and an upper electrode 100c. Also, a third insulating layer 110 is formed on the capacitor 100 and the second insulating layer 109. The lower electrode 100a is formed by patterning a platinum layer. Also, the ferroelectric layer 100b is formed by patterning a PZT layer, for example. Also, the upper electrode 100c is formed by patterning an iridium oxide layer, for example.

The ferroelectric capacitor 100, the third insulating layer 110, and the contact region of the lower electrode 100a are covered with a capacitor-protection insulating film 113 made of aluminum oxide.

First and second contact holes 110a, 110c are formed in the first to third insulating layers 108 to 110 on the impurity diffusion regions 106a, 106c located near both ends of the well region 103 respectively. A third contact hole 110b is formed in the first to third insulating layers 108 to 110 on the impurity diffusion region 106b located between two gate electrodes 104a, 104b. Also, as shown in FIG. 1, a fourth contact hole 110d is formed in the third insulating layer 110 on the contact region that is located near the end of the lower electrode 100a and is not covered with the ferroelectric layer 100b.

First to fourth conductive plugs 111a to 111d each made of an adhesive conductive layer and a tungsten layer are formed in the first to fourth contact holes 110a to 110d. Also, a fifth contact hole 112 is formed on the upper electrode 100c of the capacitor 100.

A first wiring 120a, which is connected to an upper surface of the first conductive plug 111a and also connected to the upper electrode 100c via the fifth contact hole 112, is formed on the third insulating layer 110. Also, a second wiring 120c, which is connected to an upper surface of the second conductive plug 111c and also connected to another upper electrode 100c via another fifth contact hole 112, is formed on the third insulating layer 110. Also, a conductive pad 120b is formed on the third insulating layer 110 and the third conductive plug 111b. Also, a third wiring 120d, which is connected to the fourth conductive plug 111d located on the contact region of the lower electrode 100a, is formed on the third insulating layer 110.

In the meanwhile, as the third insulating layer 110 formed on the capacitor 100 and the second insulating layer 109, normally a silicon oxide layer formed by the plasma CVD method using TEOS as the material is employed. Such insulating layer is also set forth in Patent Application Publication (KOKAI) 2001-60669, for example.

However, the insulating layer that is formed by using TEOS as the material causes the end deterioration of the ferroelectric capacitor. The end deterioration signifies such phenomenon that the capacitors, which are located at the end portion of the lower electrode 100 a and located in vicinity of the contact region not covered with the dielectric layer 100b, of a plurality of capacitors 100 shown in FIG. 1 are ready to deteriorate.

As the method of preventing the characteristic deterioration of the capacitor, it is set forth in Patent Application Publication (KOKAI) Hei 11-330390 that the insulating film that has the tensile stress on the ferroelectric capacitor should be formed on the capacitor. However, merely the improvement in the characteristics of one capacitor is set forth in this reference, but description is not made of the prevention of the end deterioration caused in a plurality of capacitors that are formed to use commonly one stripe-like lower electrode respectively. In addition, it is not set forth in this reference which method should be employed to improve the characteristics of a plurality of capacitors uniformly with regard to the prevention of the end deterioration.

SUMMARY OF THE INVENTION

It is an object of the present invention to provide a semiconductor device manufacturing method capable of improving characteristics of a capacitor irrespective of a forming position of the capacitor on an insulating film.

According to one aspect of the present invention, there is provided a method of manufacturing a semiconductor device comprising the steps of: forming a first insulating film over a semiconductor substrate; forming a capacitor having a lower electrode, a ferroelectric layer, and an upper electrode over the first insulating film; and growing a second insulating film over the first insulating film and the capacitor by using a mixed gas containing a compound gas of oxygen and nitrogen, TEOS, and oxygen.

According to the present invention, as the growth gas used to grow the interlayer insulating film that covers the capacitor, the mixed gas containing not only TEOS and oxygen but also the compound gas of oxygen and nitrogen is used.

Therefore, the interlayer insulating film made of the silicon oxide film containing nitrogen and having a compressive stress of $1.5 \times 10^9$ dyne/cm$^2$ to $5.0 \times 10^8$ dyne/cm$^2$ can be formed over the ferroelectric capacitor. In addition, the interlayer insulating film having small stress and small contained moisture can be formed. Thus, end deterioration of a plurality of capacitors can be prevented and also the characteristics of the overall plural capacitors that are covered with the interlayer insulating film can be maintained well.

Also, since the flow rate of the O$_2$ gas in the growth gas is increased rather than the prior art, an amount of contained moisture in the interlayer insulating film can be reduced further rather than the prior art and thus the characteristics of the capacitor can be maintained much better.

DETAILED DESCRIPTION OF THE PREFERRED EMBODIMENT

An embodiment of the present invention will be explained with reference to the drawings hereinafter.

FIGS. 3A to 3J are sectional views showing steps of manufacturing a semiconductor device according to an embodiment of the present invention. FIG. 4 is a plan view showing arrangement of a plurality of capacitors and a plurality of transistors in a memory cell region of the semiconductor device according to the embodiment of the present invention. In this case, FIGS. 3A to 3J are sectional views taken along a II—II line in FIG. 4.

Figure 3A:
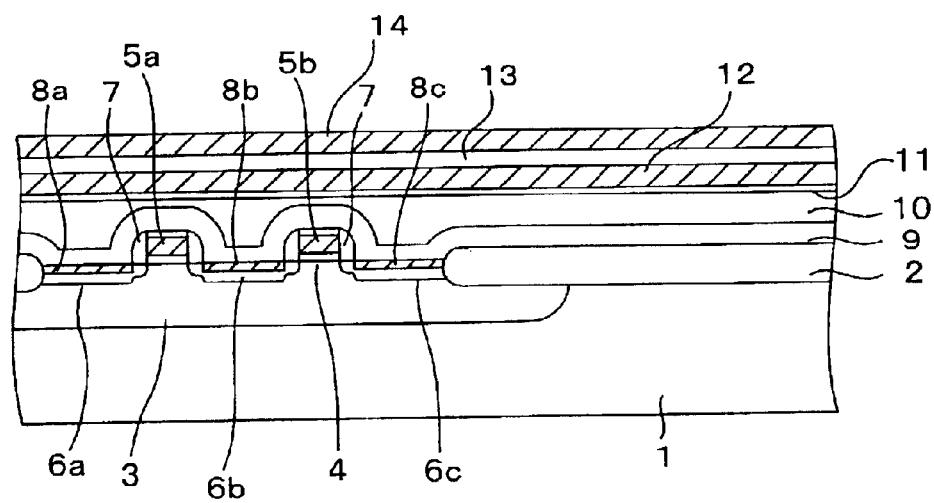
FIGS. 3A to 3J are sectional views showing steps of manufacturing a semiconductor device according to an embodiment of the present invention.
Figure 4:
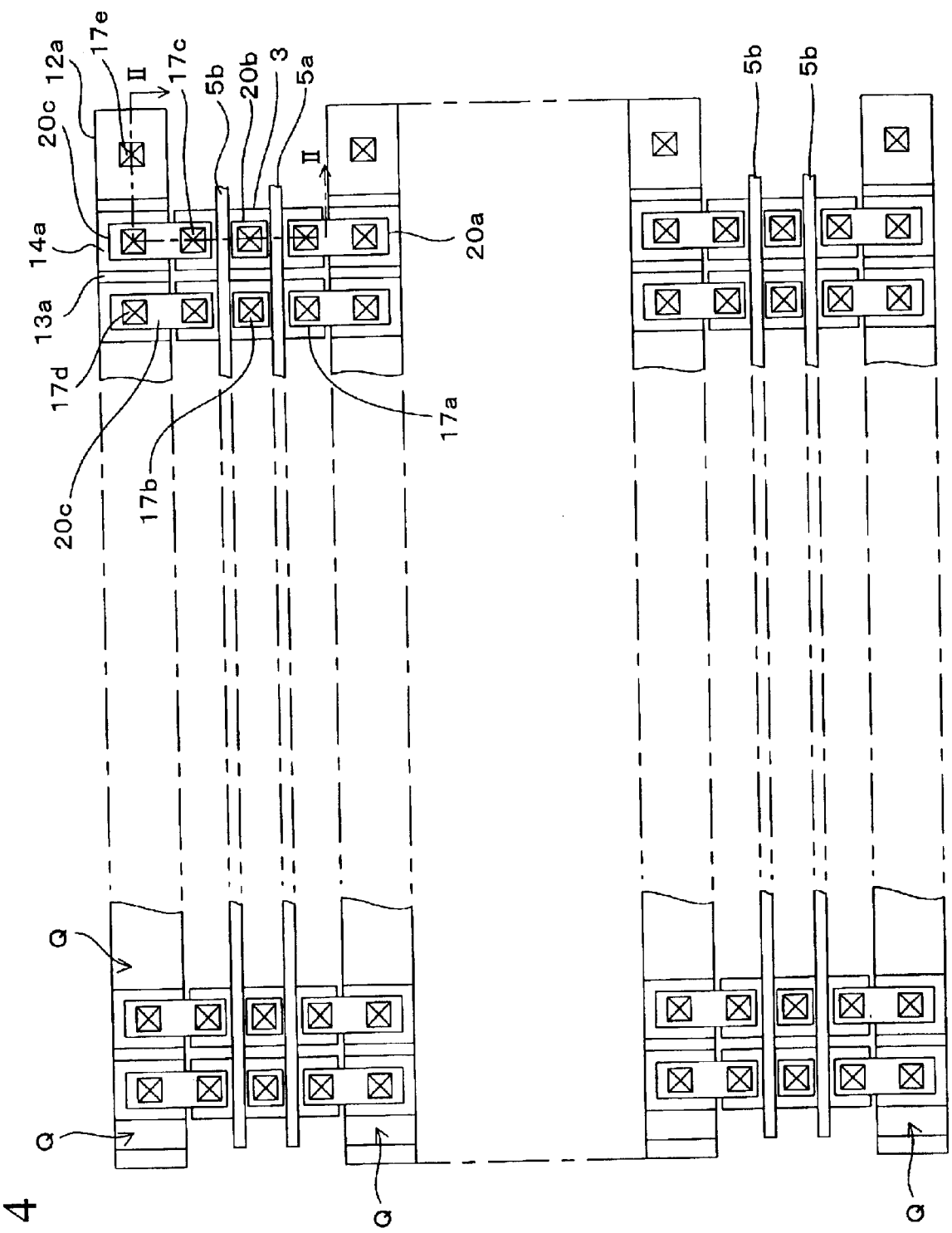
FIG. 4 is a plan view showing capacitors and transistors formed by the embodiment of the present invention.

Next, steps required until a sectional structure shown in FIG. 3A is formed will be explained hereunder.

First, an element isolation insulating layer 2 is formed around an active region (transistor forming region) of an n-type or p-type silicon (semiconductor) substrate 1 by the LOCOS (Local Oxidation of Silicon) method. In this case, the STI (Shallow Trench Isolation) structure may be employed as the element isolation insulating layer 2.

Then, a p-well 3 is formed by introducing the p-type impurity into a plurality of active regions, which are arranged vertically and laterally at an interval in the memory cell region on the silicon substrate 1, respectively. Then, a silicon oxide layer serving as a gate insulating layer 4 is formed by thermally oxidizing surfaces of the active regions on the silicon substrate 1.

Then, an amorphous silicon or polysilicon layer and a tungsten silicide layer are formed sequentially on the overall upper surface of the silicon substrate 1. Then, gate electrodes 5a, 5b are formed by patterning the silicon layer and the tungsten silicide layer by virtue of the photolithography method.

Two gate electrodes 5a, 5b are arranged in almost parallel at a distance on each p-well 3 in the memory cell region. These gate electrodes 5a, 5b constitute a part of the word line.

Then, the n-type impurity is ion-implanted into the p-well 3 on both sides of the gate electrodes 5a, 5b. Thus, first to third n-type impurity diffusion regions 6a, 6b, 6c serving as the source/drain of the n-channel MOS transistor are formed.

Then, an insulating layer is formed on the overall surface of the silicon substrate 1. Then, sidewall insulating layers 7 are left on both side portions of the gate electrodes 5a, 5b by etching back the insulating layer. As the insulating layer, an silicon oxide ($SiO_2$) is formed by the CVD method, for example.

Then, the n-type impurity is ion-implanted again into the p-well 3 by using the gate electrodes 5a, 5b and the sidewall insulating layers 7 as a mask. Thus, the first to third n-type impurity diffusion regions 6a, 6b, 6c are formed into the LDD structure.

As described above, in the memory cell region, the first MOS transistor consists of the p-well 3, the gate electrode 5a, the first and second n-type impurity diffusion regions 6a, 6b, etc. Also, the second MOS transistor consists of the p-well 3, the gate electrode 5b, the second and third n-type impurity diffusion regions 6b, 6c, etc. The first and second MOS transistors are arranged in plural in the memory cell region vertically and laterally.

Then, a refractory metal layer is formed on the overall surface. Then, refractory metal silicide layers 8a to 8c are formed on the n-type impurity diffusion regions 6a to 6c respectively by heating this refractory metal layer. Then, the unreacted refractory metal layer is removed by the wet etching. There are cobalt, tantalum, etc. as the refractory metal.

Then, a silicon oxide nitride (SiON) layer of about 200 nm thickness is formed as an oxidation-preventing insulating layer 9 on the overall surface of the silicon substrate 1 by the plasma CVD (P-CVD) method. Then, a silicon dioxide ($SiO_2$) of about 1500 nm thickness is grown as a first interlayer insulating film 10 on the oxidation-preventing insulating layer 9 by the plasma CVD method using a TEOS (tetraethoxysilane) gas, or the like. Then, the first interlayer insulating film 10 is thinned by the chemical mechanical polishing (CMP) method to planarize a surface thereof. Then, the silicon substrate 1 is put into the horizontal furnace, then the nitrogen ($N_2$) is introduced into the horizontal furnace, and then the first interlayer insulating film 10 is annealed at the substrate temperature of 650° C. for 30 minute. Accordingly, the densifying process and the dehydrating process of the first interlayer insulating film 10 are carried out.

Then, a titanium (Ti) layer having a thickness of about 10 to 50 nm, preferably 20 nm, is formed on the first interlayer insulating film 10. Then, the titanium layer is annealed at the substrate temperature of 700° C. for 60 second in the 1% oxygen atmosphere by RTA (Rapid Thermal Annealing). Thus, the titanium layer is changed into a titanium oxide layer 11.

Then, a platinum (Pt) layer is formed as a first conductive layer 12 on the titanium oxide layer 11 by the sputter method. A thickness of the Pt layer is set to about 100 to 300 nm, e.g., 150 nm. In this case, the first conductive layer 12 is formed of a noble metal layer made of platinum, iridium, or the like.

Then, a PZT (lead zirconate titanate) layer, into which calcium (Ca), strontium (Sr), and lanthanum (La) are doped, is formed as a ferroelectric layer 13 on the first conductive layer 12 by the sputter method to have a thickness of 100 to 300 nm, e.g., 180 nm. The PZT into which Ca, Sr, and La are doped is called PLCSZT.

In this case, as the method of forming the ferroelectric layer 13, there are the MOD (Metal Organic Deposition) method, the MOCVD (Metal Organic CVD) method, the sol-gel method, etc. in addition to this. Also, as the material of the ferroelectric layer 13, there are other PZT material such as PZT, PLZT, etc., the Bi-layered structure compound material such as $SrBi_2Ta_2O_9$, $SrBi_2(Ta,Nb)_2O_9$, etc., and other metal oxide ferroelectric substance in addition to PLCSZT.

Then, an iridium oxide ($IrO_x$) layer of about 50 nm thickness is formed on the ferroelectric layer 13 by the sputter method. Then, crystallization is completed by annealing the ferroelectric layer 13 via the $IrO_x$ layer in the oxygen atmosphere by virtue of RTA. As the RTA conditions in the oxygen atmosphere, 725° C. and 20 second, for example, are selected.

Then, the $IrO_x$ layer of 150 nm thickness is formed again as a cap layer on the $IrO_x$ layer. The $IrO_x$ layers formed twice on the ferroelectric layer 13 are used as a second conductive layer 14.

Figure 3B:
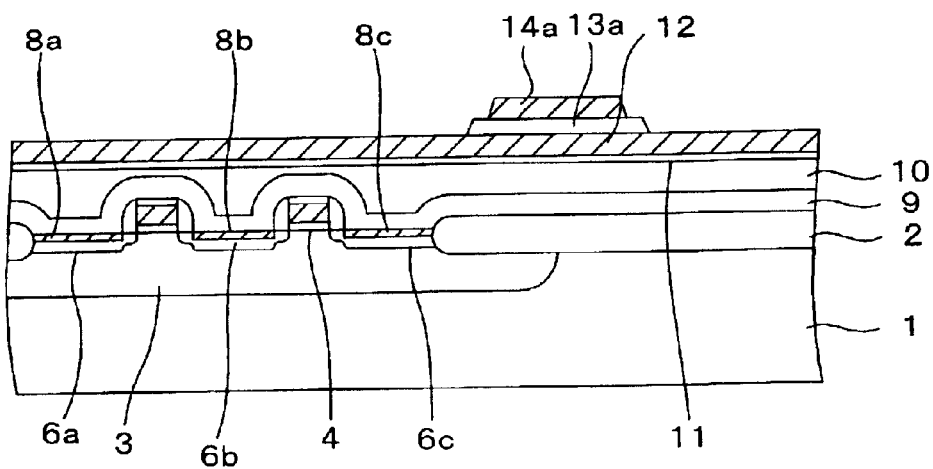

Next, steps required until a structure shown in FIG. 3B is formed will be explained hereunder.

First, the second conductive layer 14 is patterned by the photolithography method while using a first resist pattern (not shown). Thus, a plurality of upper electrodes 14a are formed over the element isolation insulating layer 2 in vicinity of the first and third n-type impurity diffusion regions 6a, 6c along the extending direction of the word line.

Then, the first resist pattern is removed. Then, the ferroelectric layer 13 is annealed at the temperature of 650° C. for 60 minute in the oxygen atmosphere. This annealing is executed to recover the ferroelectric layer 13 from the damage caused during the sputtering and the etching.

Then, a second resist pattern (not shown) is formed on the upper electrodes 14a and their peripheries. Then, the ferroelectric layer 13 is etched by using the second resist pattern as a mask, whereby the left ferroelectric layer 13 is used as a dielectric layer 13a of the ferroelectric capacitor Q. Then, the second resist pattern is removed. Then, the oxygen annealing is carried out to prevent peeling-off of respective layers that are located on and over the first interlayer insulating film 10.

Figure 3C:
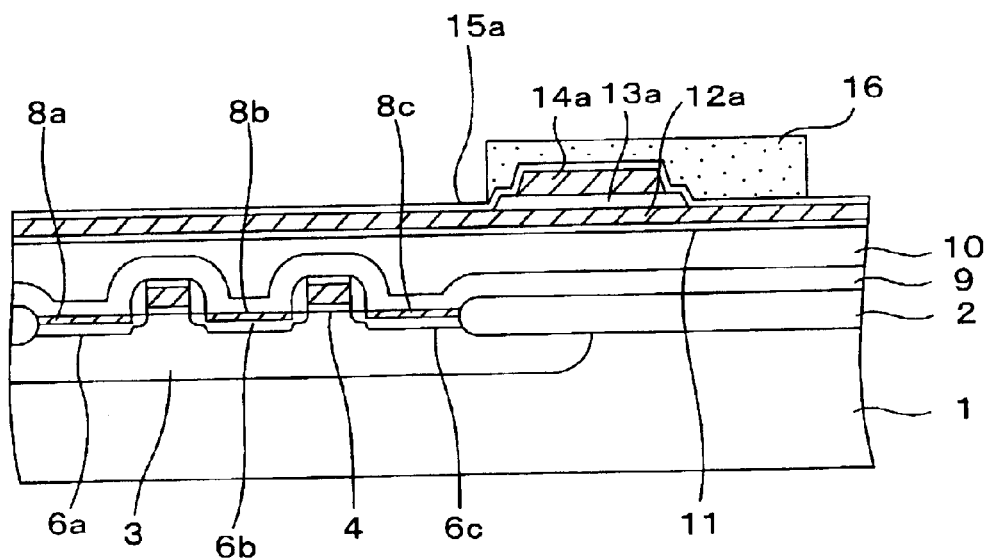

Then, as shown in FIG. 3C, a first capacitor protection insulating layer 15a made of aluminum oxide ($Al_2O_3$) and having a thickness of 10 to 50 nm is formed on the upper electrodes 14a, the dielectric layers 13a, and the first conductive layer 12 by the sputter. Then, the oxygen annealing is carried out to relieve the damage of the dielectric layer 13a from the sputter.

Then, a stripe-like third resist pattern 16, which covers a plurality of upper electrodes 14a and the dielectric layers 13a collectively in a line along the extending direction of the word line, is formed on the first capacitor protection insulating layer 15a. Then, the first capacitor protection insulating layer 15a, the first conductive layer 12, and the titanium oxide layer 11 are etched by using the third resist pattern 16 as a mask. Accordingly, the first conductive layer 12 that is left below a plurality of upper electrodes 14a and their peripheries is used as a lower electrode 12a of the ferroelectric capacitor Q. The lower electrode 12a has a stripe shape that passes through below a plurality of upper electrodes 14a that are aligned in the word line direction.

Accordingly, as shown in FIG. 4, the ferroelectric capacitor Q consisting of the lower electrode 12a, the dielectric layers 13a, and the upper electrode 14a is formed on the first interlayer insulating film 10. Also, a plurality of ferroelectric capacitors Q are formed at an interval vertically and laterally in the memory cell region. In this case, the number of the upper electrodes formed over the lower electrode 12a coincide with the number of the capacitors.

Figure 3D:
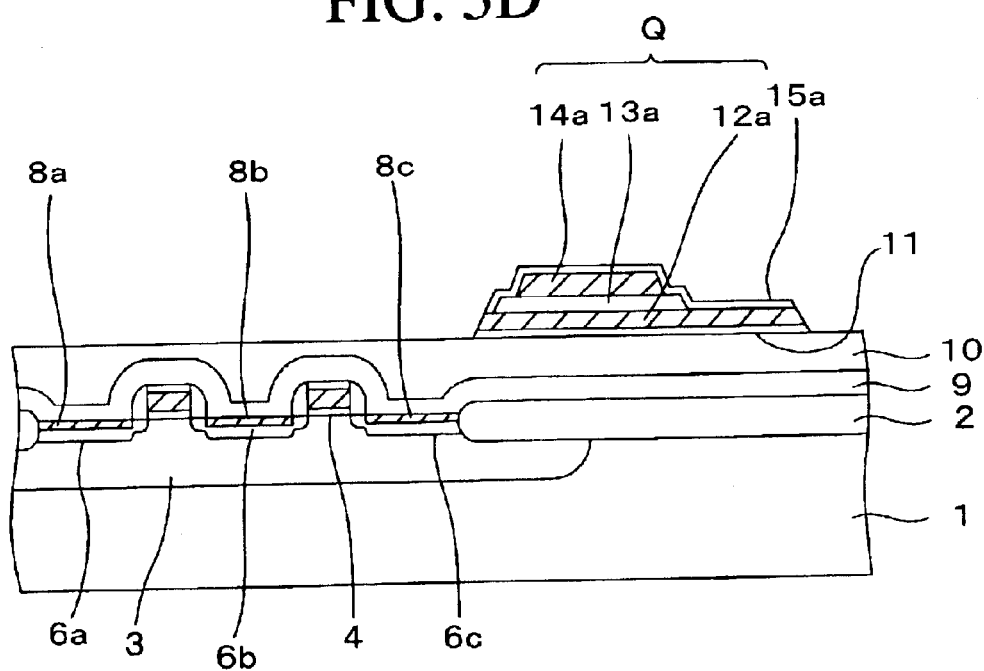

Then, as shown in FIG. 3D, the ferroelectric capacitor Q that is covered with the first capacitor protection insulating layer 15a appears when the third resist pattern 16 is removed. Then, the ferroelectric capacitor Q is annealed at the temperature of 650° C. for 60 minute in the oxygen atmosphere. Thus, the dielectric layers 13a can be recovered from the damage and also the peeling-off of the films constituting the ferroelectric capacitor Q can be prevented.

Figure 3E:
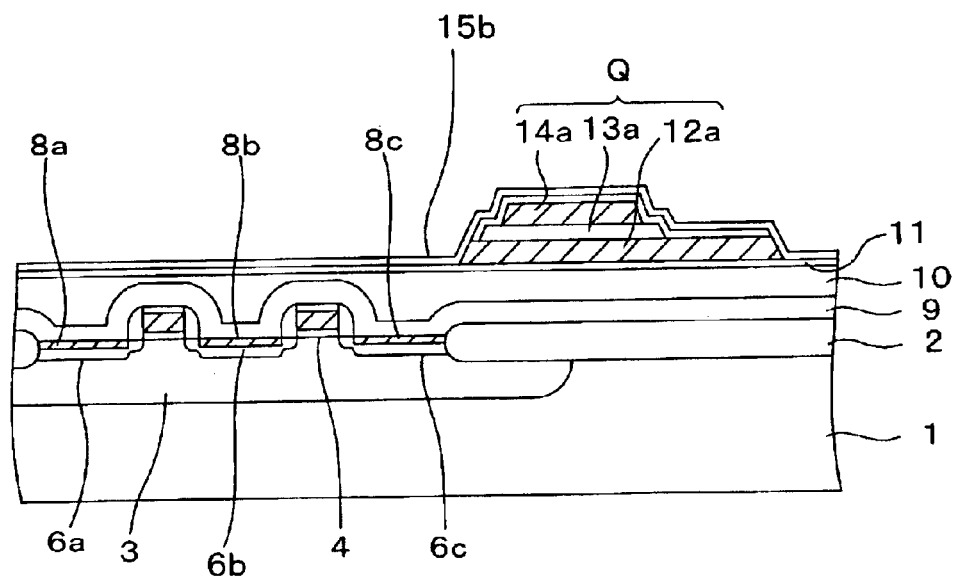

Then, as shown in FIG. 3E, a second capacitor protection insulating layer 15b is formed on the ferroelectric capacitor Q and the first interlayer insulating film 10 by the sputter. As the second capacitor protection insulating layer 15b, aluminum oxide of 10 to 50 nm thickness, for example, is employed. Then, in order to reduce the leakage current of the ferroelectric capacitor Q, the ferroelectric capacitor Q is annealed in the oxygen atmosphere. In this case, as the capacitor protection insulating layers 15a, 15b, PZT material or titanium oxide may be employed besides the aluminum oxide.

Figure 3F:
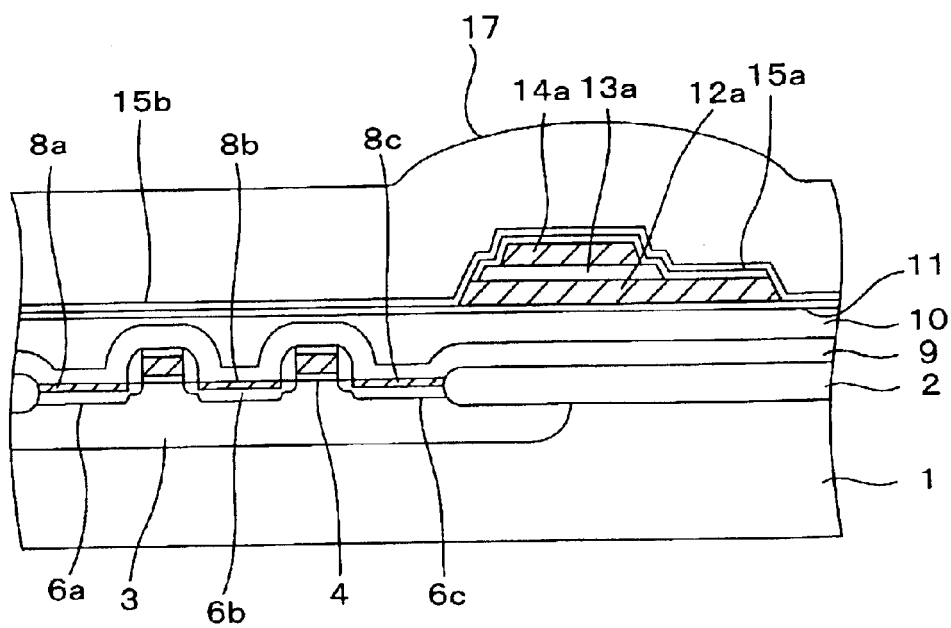

Then, as shown in FIG. 3F, a second interlayer insulating film 17 made of silicon oxide and having a thickness of 1.5 µm is formed on the second capacitor protection insulating layer 15b by the plasma-enhanced CVD method using a mixed gas containing TEOS under the conditions that an $O_2$ gas is increased rather than the prior art and an $N_2O$ gas is added.

As the conditions of forming the second interlayer insulating film 17, for example, the TEOS gas, the $O_2$ gas, the He gas, and the $N_2O$ gas are introduced into the growth atmosphere at flow rates of 460 sccm, 1400 sccm, 480 sccm, and 750 sccm respectively, a pressure of the growth atmosphere is lowered up to 9.0 Torr, a heating temperature of the silicon substrate 1 in the growth atmosphere is set to 390° C., and an electric power applied to generate the plasma in the growth atmosphere is 400 W. In this case, the He gas is employed as the carrier gas of TEOS in some cases. The carrier gas consists of the inert gas such as He, Ar, or the like.

The silicon oxide film formed under such conditions has small compressive stress and a small amount of contained moisture on the second capacitor protection insulating layer 15b. In addition, nitrogen is contained in the silicon oxide film. Details of the method of forming the second interlayer insulating film 17 made of such silicon oxide will be described later.

Figure 3G:
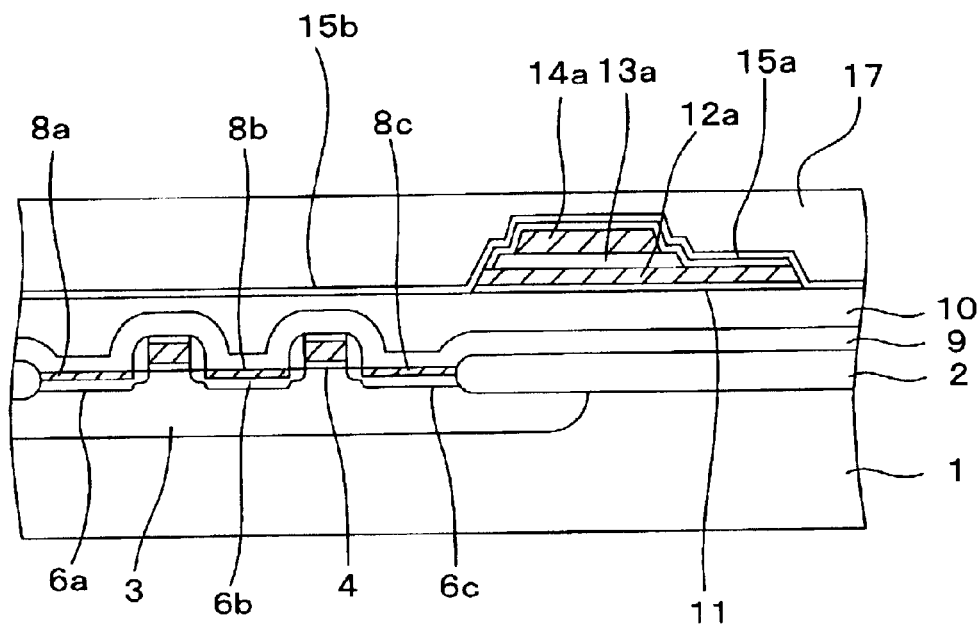

Then, as shown in FIG. 3G, an upper surface of the second interlayer insulating film 17 is planarized by the CMP method. Then, the surface of the second interlayer insulating film 17 is exposed to the $N_2O$ plasma.

Figure 3H:
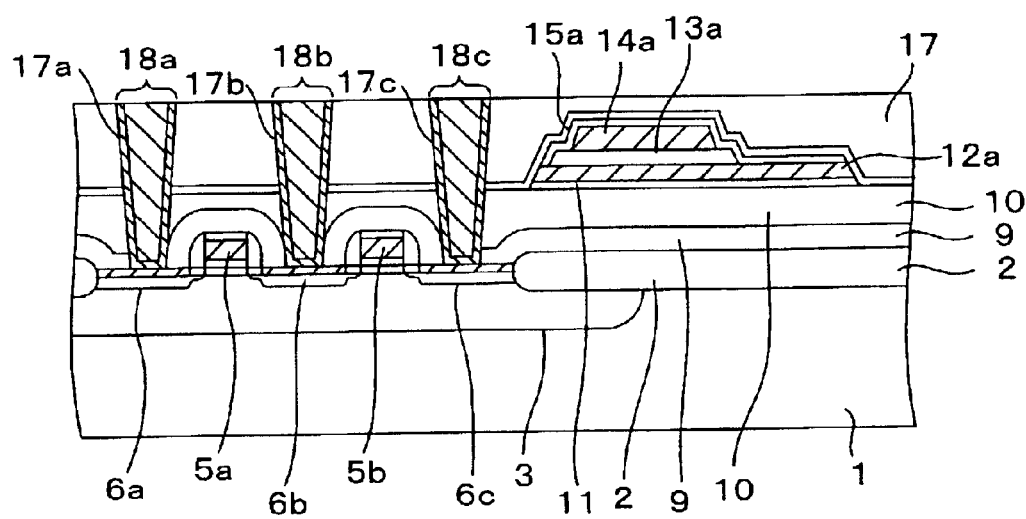

Next, steps required until a structure shown in FIG. 3H is formed will be explained hereunder.

First, the second interlayer insulating film 17, the second capacitor protection insulating layer 15b, the first interlayer insulating film 10, and the oxidation-preventing insulating layer 9 are patterned by the photolithography method. Thus, first to third contact holes 17a to 17c are formed on the first to third n-type impurity diffusion regions 6a to 6c in the p-well 3 respectively.

Then, a titanium (Ti) layer of 20 nm thickness and a titanium nitride (TiN) layer of 50 nm thickness are formed sequentially on the second interlayer insulating film 17 and inner surfaces of the first to third contact holes 17a to 17c by the sputtering method. These layers constitute an adhesive conductive layer. Then, a tungsten layer is formed on the adhesive conductive layer by the CVD method using a mixed gas consisting of tungsten hexafluoride ($WF_6$), argon, and hydrogen. In this case, a thickness of the tungsten layer is set to bury respective contact holes 17a to 17c perfectly.

Then, the tungsten layer and the adhesive conductive layer on the second interlayer insulating film 17 are removed by the CMP method, so that these layers are left only in the contact holes 17a to 17c. Thus, the tungsten layer and the adhesive conductive layer being left in the contact holes 17a to 17c are used as first to third conductive plugs 18a to 18c respectively.

In this case, in each p-well 3, the second conductive plug 18b formed on the n-type impurity diffusion region 6b being put between two gate electrodes 5a, 5b is connected electrically to the bit line formed over the second conductive plug 18b. Also, the first and third conductive plugs 18a, 18c formed on both sides of the second conductive plug 18b are connected electrically to the upper electrodes 14a of separate ferroelectric capacitors Q via wirings described later respectively.

Figure 3I:
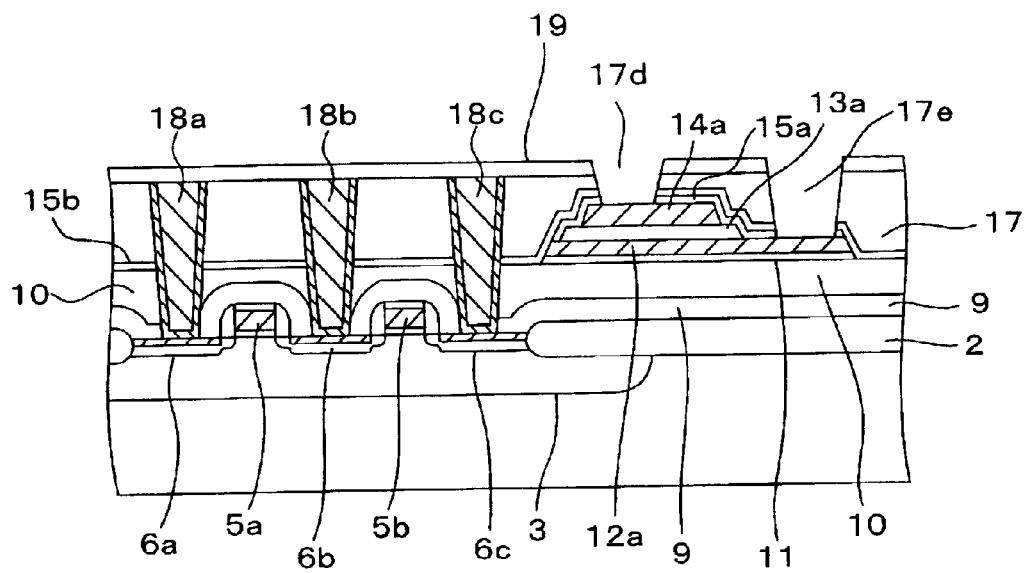

Next, steps required until a structure shown in FIG. 3I is formed will be explained hereunder.

First, an SiON layer of about 100 nm thickness, for example, is formed on the second interlayer insulating film 17 and the first to third conductive plugs 18a to 18c by the plasma CVD method. This SiON layer is formed by using a mixed gas of silane ($SiH_4$) and $N_2O$. The SiON layer is used as an overlying oxidation-preventing insulating layer 19 to prevent the oxidation of the first to third conductive plugs 18a to 18c.

Then, the oxidation-preventing insulating layer 19, the second interlayer insulating film 17, and the capacitor protection insulating layers 15a, 15b are patterned by the photolithography method. Thus, a fourth contact hole 17d is formed on the upper electrode 14a of the ferroelectric capacitor Q, and simultaneously a fifth contact hole 17e is formed on the contact region of the lower electrode 12a, which is not covered with the upper electrode 14a.

Then, layer quality of the dielectric layer 13a is improved by annealing the ferroelectric capacitor Q via the fourth contact hole 17d at 550° C. for 60 minute in the oxygen atmosphere. In this case, oxidation of the first to third conductive plugs 18a to 18c is prevented by the oxidation-preventing insulating layer 19.

After this, the overlying oxidation-preventing insulating layer 19 is removed by the dry etching using the CF gas.

Then, a conductive layer containing aluminum is formed on the second interlayer insulating film 17 and the first to third conductive plugs 18a to 18c and in the fourth and fifth contact holes 17d, 17e by the sputter method. As the conductive layer, a multi-layered metal structure that is constructed by forming a titanium nitride layer, a copper-containing aluminum layer, a titanium layer, and a titanium nitride layer sequentially is employed. An amount of contained copper in the copper-containing aluminum layer is set to 0.5 atoms %, for example.

Figure 3J:
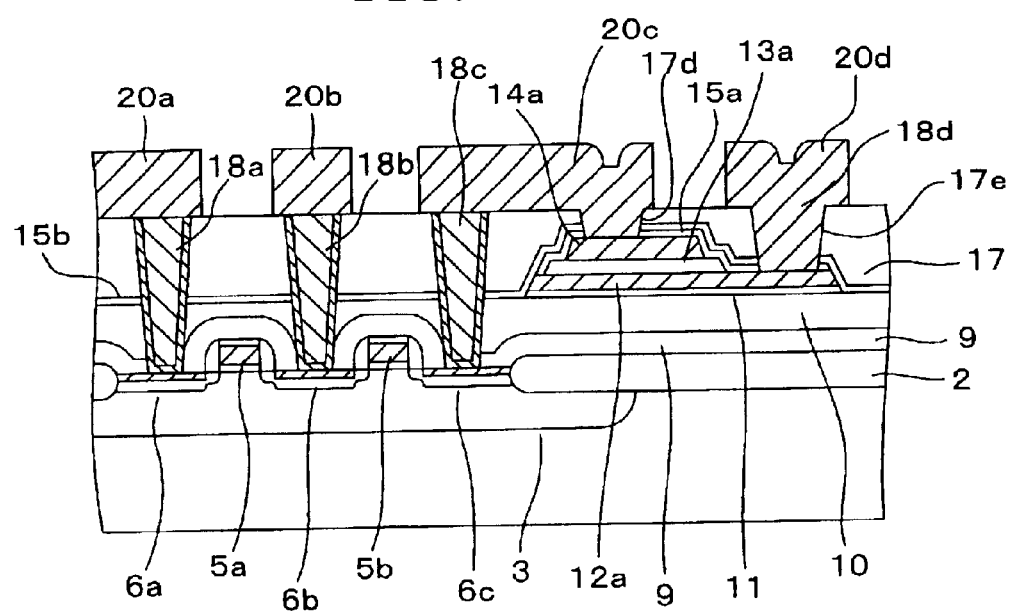

Then, as shown in FIG. 3J, the conductive layer is patterned by the photolithography method. Thus, a wiring 20c for connecting electrically the third conductive plug 18c formed on the third n-type impurity diffusion region 6c to the upper electrode 14a via the fourth contact hole 17d is formed. At the same time, a conductive pad 20b is formed on the second conductive plug 18b between two gate electrodes 5a, 5b on the p-well 3. Also, another wiring 20d that is connected to the lower electrode 12a of the ferroelectric capacitor Q via the fifth contact hole 17e is formed by patterning the conductive layer. In addition, a wiring 20a that is connected to the upper electrode of another ferroelectric capacitor Q is formed on the first conductive plug 18a.

A positional relation among the wirings 20a, 20c, 20d and the conductive pad 20b and the transistor is shown in FIG. 4.

Then, a third interlayer insulating film, a second-layer conductive plug, the bit line, a cover layer, etc. are formed, but their details will be omitted herein.

According to the above embodiment, in the case that the second interlayer insulating film 17 is to be formed on the capacitor Q and the first interlayer insulating film 10, when a compound gas of the nitrogen and the oxygen, e.g., $N_2O$ is added in addition to TEOS, helium, and oxygen as the reaction gas, end deterioration in the ferroelectric capacitors formed in plural is prevented. In other words, the compressive stress of the second interlayer insulating film 17 is reduced by using such reaction gas. In addition, reduction of an amount of moisture in the second interlayer insulating film 17 is achieved by increasing a flow rate of the oxygen contained in the reaction gas rather than the prior art. That is, both the reduction of the stress of the second interlayer insulating film 17 and the reduction of an amount of contained moisture are achieved by the addition of $N_2O$ and the increase of $O_2$.

Therefore, a relationship between deterioration of characteristics of the ferroelectric capacitor Q and growth conditions of the second interlayer insulating film 17 will be explained in detail hereinafter.

Figure 5:
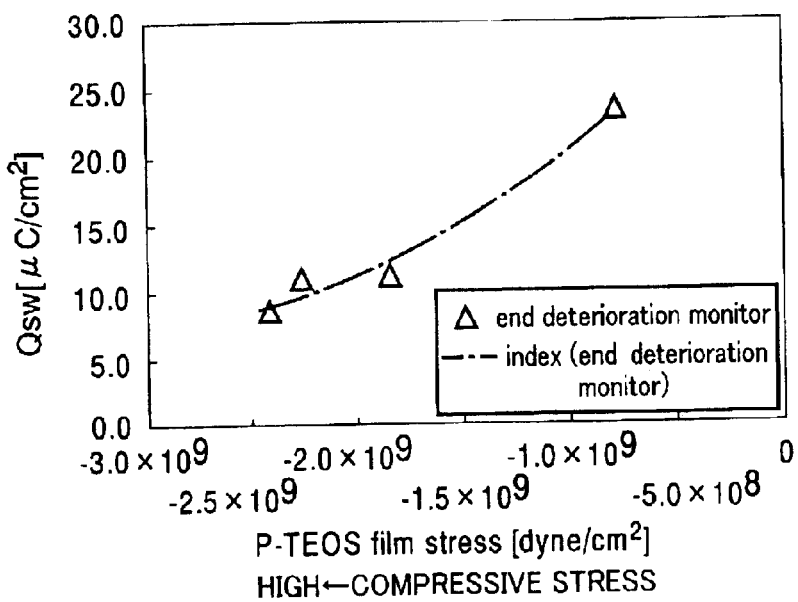
FIG. 5 is a view showing a relationship between a stress of a P-TEOS film for covering a capacitor and a switching charge Q$_{SW}$ of the capacitor.

According to results of the experiments made by inventors of the present invention, it was found that, if the interlayer insulating film that is formed by the plasma CVD method using TEOS as the material is formed directly on the capacitor, the end deterioration explained in the prior art is actualized. Then, a relationship between a stress of the interlayer insulating film for covering the ferroelectric capacitor and a switching charge $Q_{SW}$ of the ferroelectric capacitor was examined. At that time, as shown in FIG. 5, the switching charge $Q_{SW}$ of the ferroelectric capacitor as the object of the end deterioration becomes larger as the stress shown in an abscissa becomes smaller, i.e., the compressive stress is reduced, and thus the preferable characteristics is obtained.

The insulating film formed by the plasma CVD method using TEOS as the material is also expressed as the P-TEOS film hereinafter.

As shown in FIGS. 3C and 3D, the stress is caused in the end portion of the lower electrode 12a formed like a stripe by etching the first conductive layer 12 while using the resist pattern 16. In this case, it is the stress in the interlayer insulating film for covering the capacitor Q that enhances the stress in the end portion to actualize such stress.

As the method of preventing the influence of such stress, in Patent Application Publication (KOKAI) Hei 11-330390, the interlayer insulating film is formed to have the tensile stress with respect to the ferroelectric capacitor. More particularly, the silicon oxide film (ECR-OX film) formed by the electron-cyclotron resonance growth method and the silicon oxide film (PE-TEOS film) formed by the plasma-enhanced growth method using TEOS are listed. With regard to the PE-TEOS film having the tensile stress, "the film is deposited at the RF power of about 400 W and at about 400° C. by the plasma CVD method using TEOS and $N_2O$" is set forth in the paragraph number 0021 of above Publication, but no recitation about the addition of oxygen is given. Also, in Patent Application Publication (KOKAI) Hei 11-330390, only a single capacitor is formed, but the improvement in the characteristics over a plurality of capacitors is not set forth.

Surely the silicon oxide film having the strong tensile stress can be formed if both the TEOS and the $N_2O$ gas are employed.

Figure 6:
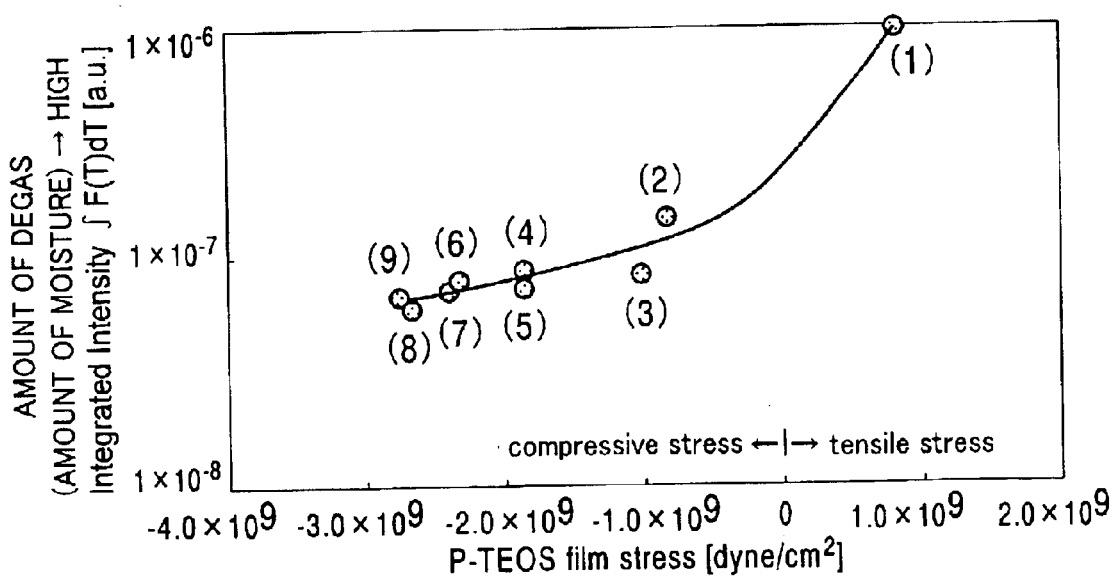
FIG. 6 is a view showing a relationship between the stress of the P-TEOS film for covering the capacitor and an amount of moisture in the P-TEOS film.

However, as shown in FIG. 6, according to the experiment made by the inventors of the present invention, an amount of moisture in the interlayer insulating film becomes large on the capacitor as the tensile stress of the interlayer insulating film becomes high. Also, an amount of degas from the interlayer insulating film is increased as an amount of moisture in the interlayer insulating film is increased, which causes the deterioration of the characteristics of the ferroelectric substance. FIG. 6 shows results measured by the TDS (Thermal Desorption Spectroscopy) method. An ordinate thereof denotes the integrated intensity value of the $H_2O$ spectrum waveform F(T) by the TDS from 100° C. to 600° C. The maximum temperature applied to the ferroelectric capacitor is 550° C. after the insulating film is formed by the plasma CVD method using TEOS, e.g., the second interlayer insulating film 17 is formed in the above embodiment. But an amount of degas was calculated up to 600° C. to have a margin. Here, the minus stress indicates the compressive stress, and the plus stress indicates the tensile stress. In this case, growth conditions of the silicon oxide films that correspond to (1) to (9) in FIG. 6 are given in Table 1.

TABLE 1

| | TEOS (sccm) | $O_2$ (sccm) | He (sccm) | $N_2O$ (sccm) | Pressure (Torr) | Power (W) | Substrate Temp (° C.) |
|---|---|---|---|---|---|---|---|
| (1) | 460 | 0 | 480 | 1000 | 9.0 | 400 | 390 |
| (2) | 460 | 700 | 480 | 1000 | 9.0 | 400 | 390 |
| (3) | 460 | 700 | 480 | 0 | 9.0 | 300 | 390 |
| (4) | 460 | 700 | 480 | 350 | 9.0 | 400 | 390 |
| (5) | 460 | 350 | 480 | 0 | 9.0 | 400 | 390 |
| (6) | 460 | 700 | 480 | 100 | 9.0 | 400 | 390 |
| (7) | 460 | 700 | 480 | 0 | 9.0 | 400 | 390 |
| (8) | 460 | 1400 | 480 | 0 | 9.0 | 400 | 390 |
| (9) | 460 | 2000 | 480 | 0 | 9.0 | 400 | 390 |

When the interlayer insulating film for covering the ferroelectric capacitor is formed under the conditions that the tensile stress is given to such film, not only can the characteristics of a single ferroelectric capacitor be improved but also the end deterioration can be prevented. However, an amount of moisture in the interlayer insulating film is increased as the side effect, and therefore the ferroelectric capacitor in the area, which is not the target of the end deterioration, is deteriorated by the gas that is escaped from the interlayer insulating film.

Figure 7:
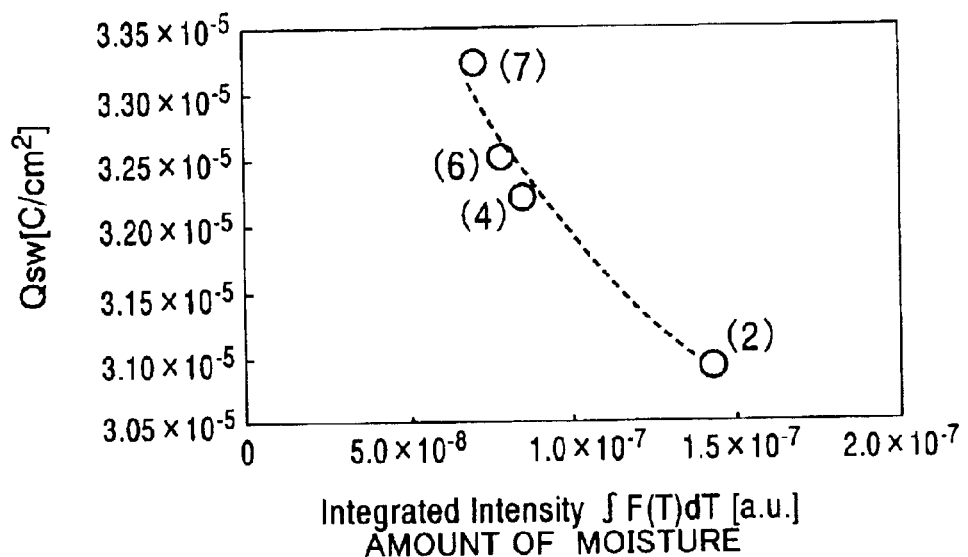
FIG. 7 is a view showing a relationship between an amount of moisture in the P-TEOS film for covering the capacitor and the switching charge Q$_{SW}$ of the capacitor.

FIG. 7 shows experimental results of the inventors of the present invention concerning a relationship between an amount of degas escaped from the interlayer insulating film on the ferroelectric capacitor and the switching charge $Q_{SW}$ of the capacitor. It is understood that the characteristics of the ferroelectric substance is deteriorated as an amount of moisture in the interlayer insulating film is increased. In this case, monitor capacitors employed in FIG. 7 are formed in plural, nevertheless the switching charge $Q_{SW}$ shows the average value. Thus, the influence of the end deterioration is substantially difficult to appear.

As for the moisture in the insulating film for covering the capacitor, it is set forth in Patent Application Publication (KOKAI) Hei 7-263637 that the insulating film is formed on the capacitor and capacitor wirings, then the protection film is formed on the insulating film, and then an amount of moisture contained in the protection film is controlled smaller than 0.5 g per 1 cm$^3$. Accordingly, it is also recited therein that the increase in the leakage current of the capacitor (capacitance element) can be prevented and also the dielectric strength of the capacitor dielectric film can be improved.

However, an amount of moisture of "0.5 g per 1 cm$^3$" in the film resides like the gel in the silicon oxide film. Thus, such film is unsuitable for the practical use as the insulating film for covering the capacitor.

In contrast, even when an amount of moisture contained in the insulating film is large, an amount of degas from the insulating film is reduced if the process in the later step after the insulating film is formed on the capacitor is carried out at a low temperature. Therefore, it may be considered that, even when a large amount of moisture is contained in the insulating film, the capacitor is never deteriorated consequently. In other words, even when the insulating film contains the moisture, such moisture does not lead to the deterioration of the capacitor unless such moisture comes up to the capacitor.

The deterioration of the ferroelectric capacitor is correlated with not an amount of moisture in the interlayer insulating film, which covers the ferroelectric capacitor, but an amount of degas escaped from the interlayer insulating film after the interlayer insulating film is formed. Surely there is such a tendency that an amount of degas is increased as an amount of moisture in the interlayer insulating film is increased. Such amount changes a lot with the quantity of heat that is applied to the interlayer insulating film after the interlayer insulating film is formed. Also, the optinum value of the degas escaped from the interlayer insulating film is related to the resistance to deterioration indicating to what extend the ferroelectric capacitor can withstand against the deterioration.

The improvement in the deterioration resistance of the ferroelectric capacitor is varied according to selection of the material of the capacitor upper electrode, optimization of the film growing methods, type of elements doped into the ferroelectric material, etc.

In the above embodiment, when the second interlayer insulating film 17 is to be formed by using TEOS, such film is formed such that the stress in the second interlayer insulating film 17 is set to the small compressive stress and also an amount of moisture in the second interlayer insulating film 17 is suppressed. Accordingly, the performance of the ferroelectric capacitor in the overall memory cell region is still maintained while suppressing the end deterioration of the ferroelectric capacitor.

Next, a mechanism for causing the end deterioration will be explained hereunder.

Figure 1:
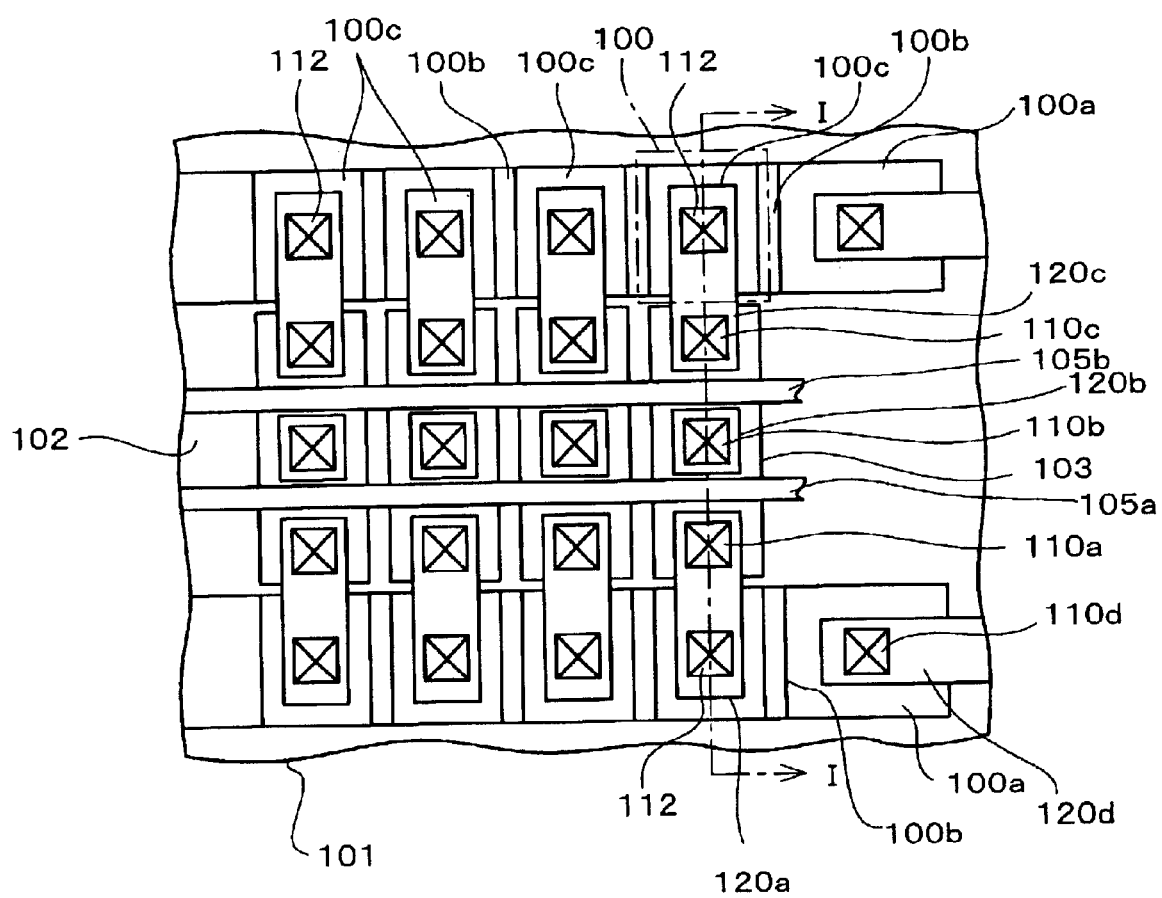
FIG. 1 is a plan view showing a semiconductor device in the prior art.
Figure 2:
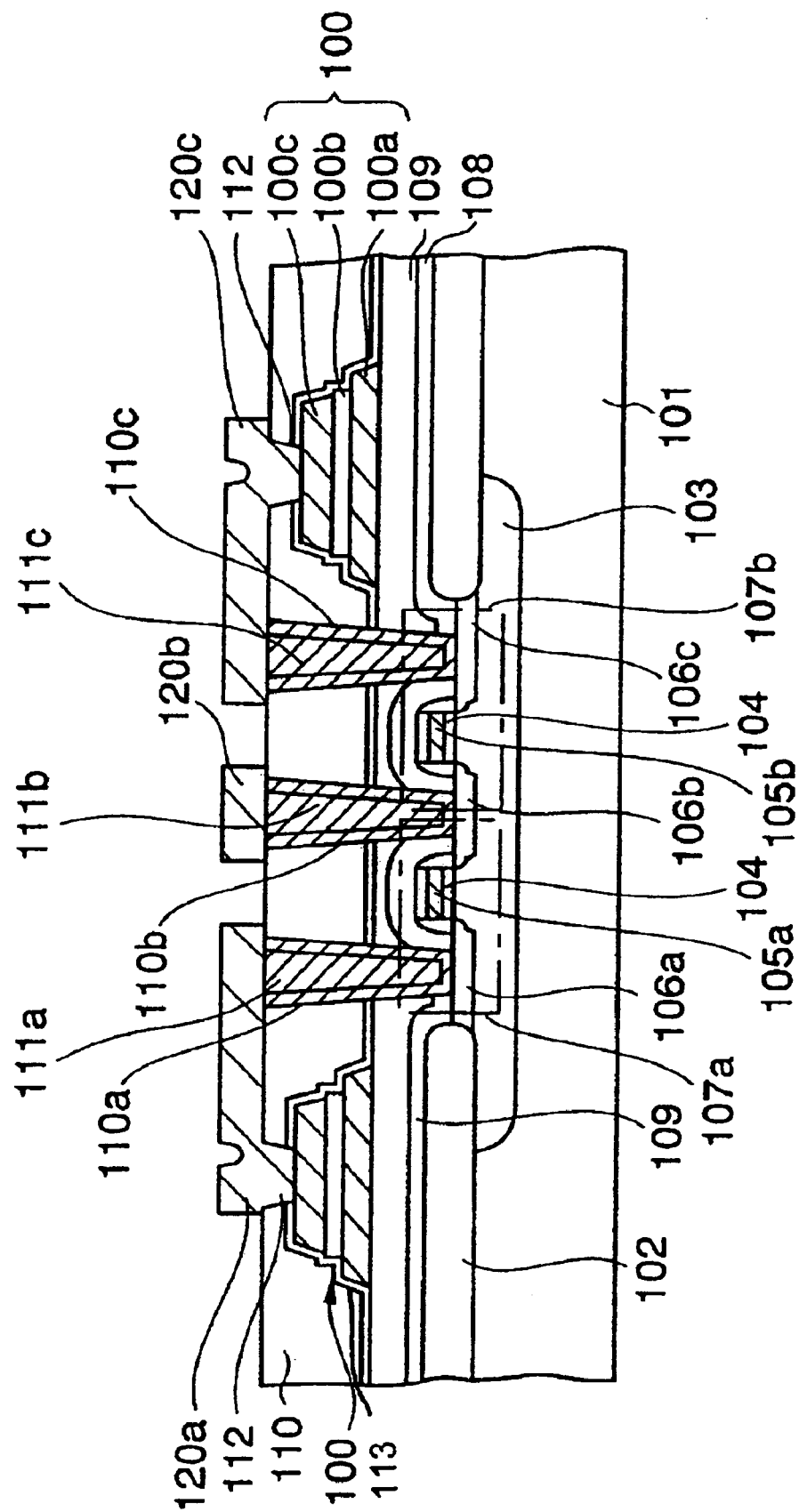
FIG. 2 is a sectional view showing the semiconductor device in the prior art.

First, as shown in FIG. 1 and FIG. 2 in the prior art, the capacitor protection insulating layer 113 made of aluminum oxide is formed on the overall surface of the contact region of the lower electrode 100a and the capacitor 100, and then the third insulating layer 110 is formed on the capacitor protection insulating layer 113 by the plasma CVD method using TEOS.

The large stress is caused in the contact region (extended region) of the lower electrode 100a by the strong compressive stress of the third insulating layer 110.

The cause of the concentration of stress to the contact portion also depends on the film forming conditions of platinum itself constituting the lower electrode 100a. However, the stress of the lower electrode 100a is the tensile stress in the order of almost 10$^{10}$ (dyn/cm$^2$), and thus the film has the strong tensile stress.

Meanwhile, the interlayer insulating layer formed near the contact region of the lower electrode 100a in the prior art has the compressive stress of 2.5×10$^9$ dyn/cm$^2$.

As a result, the force (tensile stress) generated when the platinum constituting the lower electrode 100a tends to contract and the force (compressive stress) generated when the insulating layer 110 itself tends to expand are synthesized in the ferroelectric layer 100b near the contact region of the lower electrode 100a. Thus, the large stress is applied to the side wall of the capacitor 100.

In order not to apply such stress to the capacitor, various measures are devised. In the present invention, it is intended to reduce the stress applied to the side wall of the ferroelectric capacitor by reducing the compressive stress of the insulating film itself that covers the ferroelectric capacitor, so that the deterioration of the capacitor characteristics should be prevented. However, as described above, when the insulating film that gives the tensile stress is grown by the plasma CVD method using TEOS, the end deterioration is eliminated, but the moisture in the interlayer insulating film is increased to deteriorate many ferroelectric capacitors located near the center of the memory cell region.

For this reason, as shown in the above embodiment, the local deterioration is improved by adding the compound gas of nitrogen and oxygen, e.g., N$_2$O, when the second interlayer insulating film 17 for covering the ferroelectric capacitor is formed by the plasma CVD method using TEOS. In other words, reduction in the compressive stress of the interlayer insulating film is attained by adding the compound gas of nitrogen and oxygen to the TEOS gas. Also, reduction in an amount of moisture in the insulating film is attained by flowing the oxygen added to the TEOS gas at a flow rate higher than the prior art. That is, in the case that TEOS is used to grow the silicon oxide (SiO$_2$), both the reduction in an amount of moisture in the silicon oxide film and the reduction in the stress of the silicon oxide film is achieved in the condition of which the flow rate of the oxygen added to TEOS is increased rather than the prior art and at the same time N$_2$O is further added to TEOS.

As the effect of this, the inventors of the present invention concluded such that the nitrogen compound is incorporated into the film by adding N$_2$O during growing the film by the plasma CVD method using TEOS, then such nitrogen gives the plasticity to the amorphous network of SiO$_2$ in the film, and then the compressive stress of the film itself is relaxed.

Figure 8:
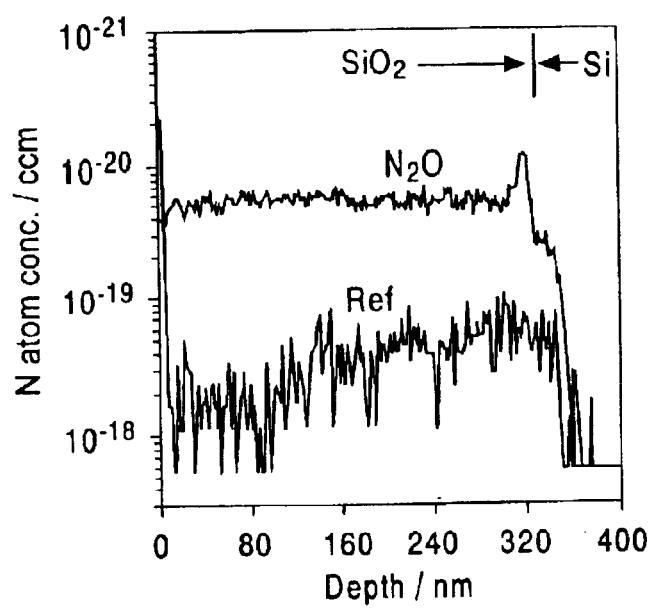
FIG. 8 is a view showing results of the SIMS analysis of the P-TEOS film formed by including N$_2$O into a reaction gas and the P-TEOS film formed by not including N$_2$O into the reaction gas.

When the SiO$_2$ film was examined by the SIMS analysis after the SiO$_2$ film was formed on the silicon (Si) wafer by using TEOS, O$_2$, He, and N$_2$O as the reaction gas, it was appreciated that, as shown by "N$_2$O" in FIG. 8, the nitrogen is incorporated into the SiO$_2$ film. In this case, N$_2$O and O$_2$ of the reaction gas are supplied to the growth atmosphere at the flow rate of 1000 sccm and 700 sccm respectively.

The capacitor is hard to be affected by the hydrogen in the condition of which a larger amount of oxygen is supplied at the time of film formation to reduce the hydrogen atom or the hydrogen ion in the plasma, and also the frequency at which the film surface is attacked by the oxygen plasma is increased when the film deposition rate is made slow. Therefore, it is considered that the hydrogen compound having the Si—OH bond and the Si—H bond and the carbon compound such as $C_2H_4$, $OC_2H_4$, etc., both being incorporated into the film up to now, are removed to thus enhance the density of the film and, as a result, an amount of moisture and an amount of hydrogen in the film are lowered and also an amount of degas is lowered.

In contrast, when the $SiO_2$ film was examined by the SIMS analysis after the $SiO_2$ film was formed on the Si wafer by using a mixed gas of TEOS, $O_2$, and He not including $N_2O$, it was appreciated that, as shown by "Ref" in FIG. 8, the nitrogen is not substantially incorporated into the $SiO_2$ film. In this case, $O_2$ in the mixed gas is supplied to the growth atmosphere at the flow rate of 700 sccm.

Figure 9:
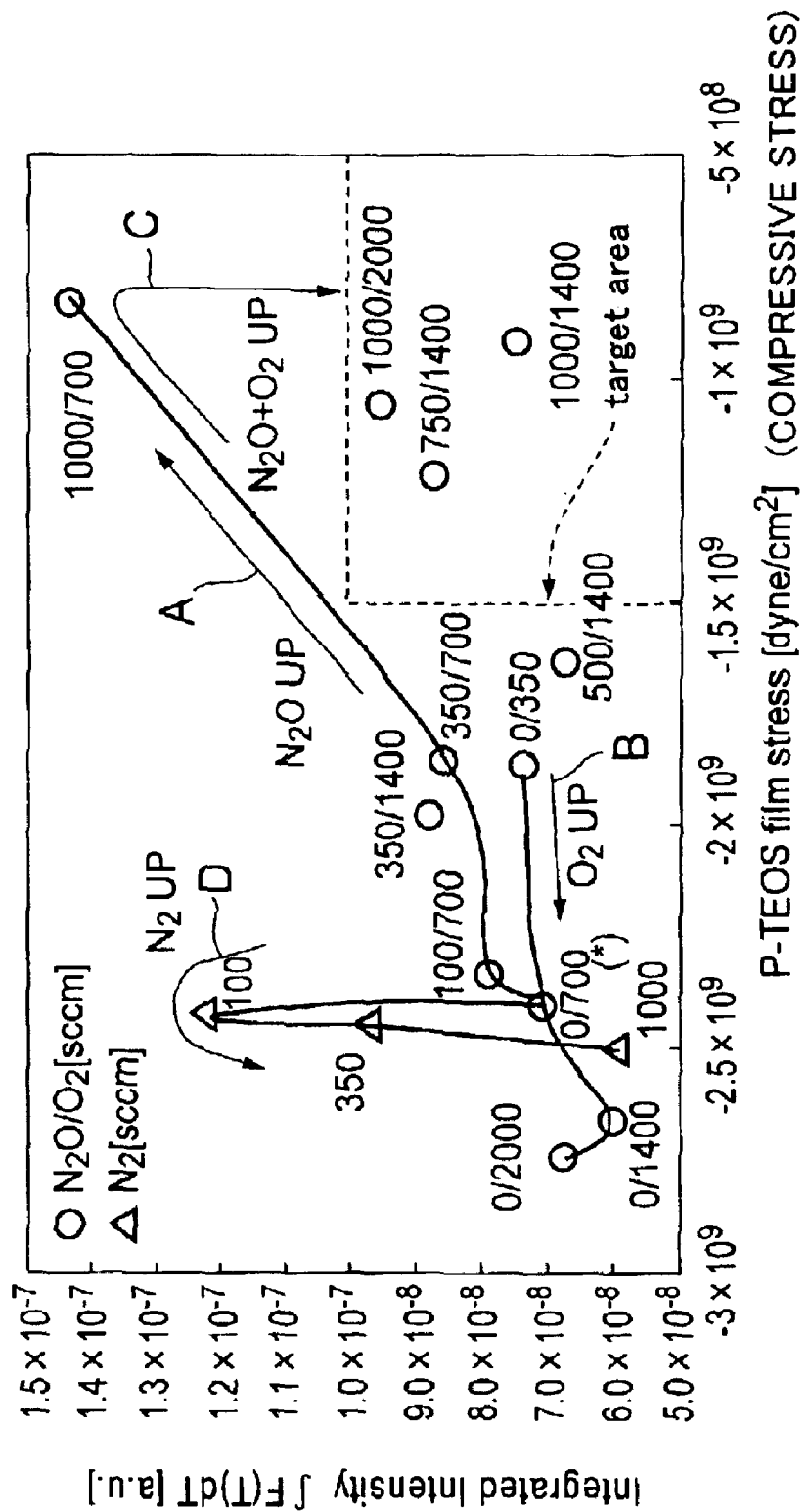
FIG. 9 is a view showing a relationship between a stress of the P-TEOS film and an amount of degas based on difference in an N$_2$O gas flow rate and an O$_2$ gas flow rate and a relationship between the stress of the P-TEOS film and an amount of degas when N$_2$ is employed in place of N$_2$O.

Next, when a relationship between a stress of the film grown by the plasma CVD method using TEOS and an amount of degas of $H_2O$ from the film was examined, experimental results shown in FIG. 9 were derived.

In the experiment, the samples in which the $SiO_2$ film is formed on a plurality of silicon substrates by the plasma CVD method using TEOS were prepared. The $SiO_2$ films in these samples are formed under various conditions. Then, the integrated intensity value of $H_2O$ (molecular weight 18) measured by TDS in the $SiO_2$ film and the stress of $SiO_2$ on the silicon substrate of respective samples are plotted, and then the growth condition that is provide a small amount of degas and the small compressive stress as the stress are set as preferable targets. As the small value of the compressive stress, a range of $1.5 \times 10^9$ dyne/cm$^2$ to $5.0 \times 10^8$ dyne/cm$^2$ is selected. The integrated intensity value is integrated in the range of the substrate temperature of 100 to 600° C., and the integrated intensity value is set as an amount of degas.

In FIG. 9, the numeral depicted on the left side of "/" indicates the flow rate (scam) of the $N_2O$ gas in the reaction gas that is introduced into the growth atmosphere, and the numeral depicted on the right side of "/" indicates the flow rate (sccm) of the $O^2$ gas in the reaction gas that is introduced into the growth atmosphere.

In FIG. 9, the point of $N_2O/O_2=0/700$ is the condition at which the end deterioration is caused in the ferroelectric capacitor in the prior art. According to this condition, an amount of moisture in the film is relatively small and this condition is preferable, but the compressive stress is increased to cause the generation of the end deterioration.

When $N_2O$ is added to the reaction gas under such condition of the oxygen gas flow rate, there is such a tendency that, every time when the flow rate of the $N_2O$ gas is increased, an amount of degas and the stress are changed in the direction indicated by an arrow A, the compressive stress value is lowered, and an amount of moisture in the P-TEOS film is increased.

In contrast, when the flow rate of oxygen in the reaction gas into which $N_2O$ is not introduced is going to be increased, there is such a tendency that an amount of degas and the stress are changed in the direction indicated by an arrow B and the compressive stress is enhanced but the moisture in the P-TEOS film is slightly reduced.

As can be understood from this, the addition of the $N_2O$ gas and the increase of the flow rate of the $O_2$ gas exhibit the trade-off actions respectively.

However, according to the results of the experiment made by the inventors of the present invention, the P-TEOS film can be formed in the preferable condition range such as the conditions applied to an area surrounded by a broken line in FIG. 9. That is, in the condition of which the $N_2O$ gas is added to the reaction gas and also the flow rate of the $O_2$ gas in the reaction gas is increased rather than the conditions in the prior art, the conditions are changed toward the conditions that give a small amount of moisture in the film and the small stress value of the compressive stress, as indicated by an arrow C.

Figure 10:
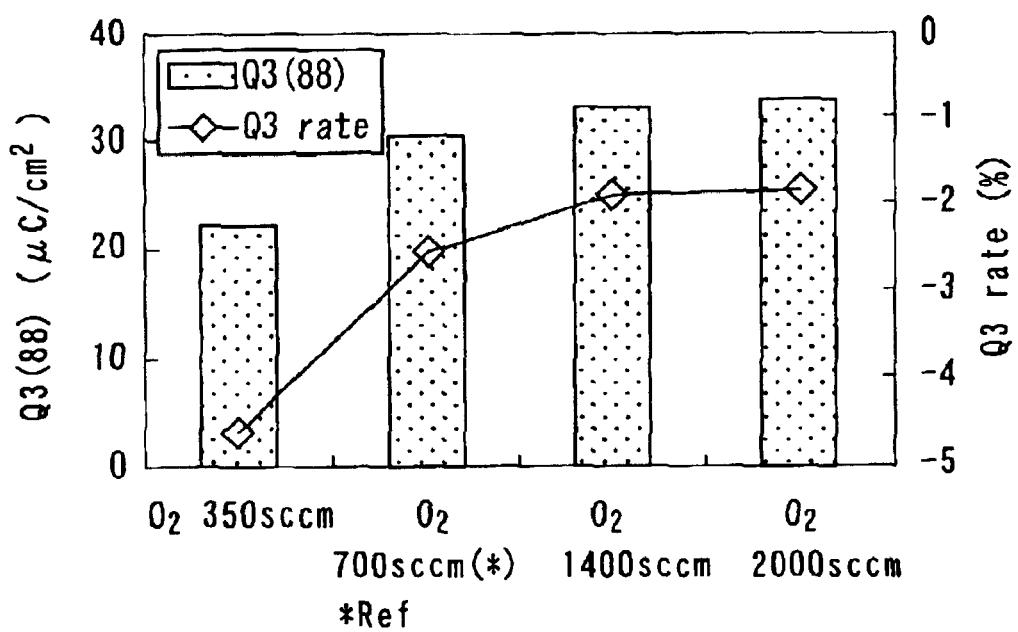
FIG. 10 is a view showing a relationship between characteristics of a cell capacitor and a flow rate of oxygen without consideration of end deterioration, in the P-TEOS film forming step in the prior art.

Also, as shown in FIG. 9, it seems that, if the $O_2$ flow rate is reduced without use of the $N_2O$ gas, the conditions can be shifted to the right in FIG. 9 as they are to come close to the target range. However, the oxygen in the plasma is reduced under the conditions and then an amount of hydrogen bonded to the oxygen is reduced, and therefore the hydrogen concentration in the plasma is relatively increased. As a result, as shown in FIG. 10, it was found that such concentration have a bad effect on the ferroelectric capacitor as the damage at the time of film formation. In this case, as shown in FIG. 10, Q3 (88) on a left-side ordinate denotes difference between an amount of polarization charge obtained after opposite signals are loaded onto a pair of capacitors in two-transistors/two-capacitors memory cell and then such memory cell is baked at 150° C. for 88 hours and an initial value of the polarization charge. Also, Q3 rate on a right-side ordinate denotes a deterioration rate of the ferroelectric capacitor after an e (e: natural logarithm) time lapsed. That is, the imprint characteristic is excellent as the value of Q3 (88) becomes large and the absolute value of Q3 rate becomes small.

Figure 11:
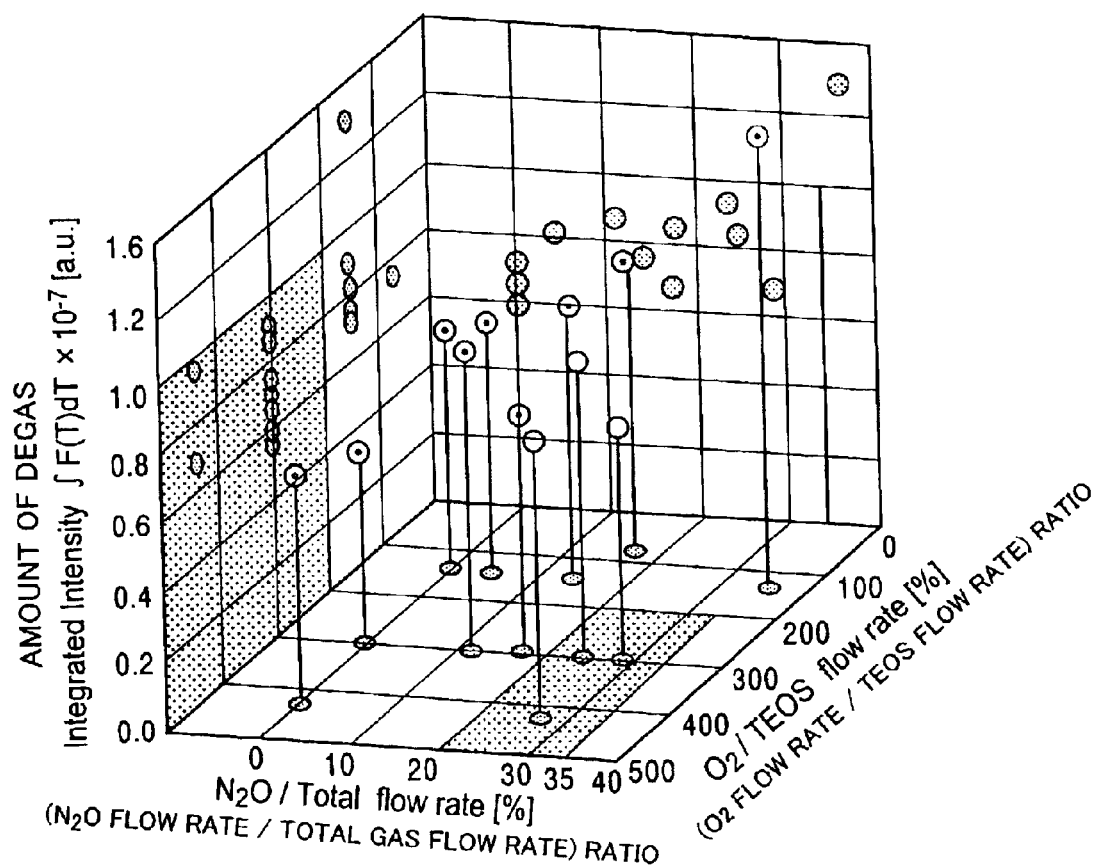
FIG. 11 is a view showing a relationship between an amount of degas of the P-TEOS film, an O$_2$/TEOS flow rate ratio and an N$_2$O/total gas flow rate ratio.

When relationships among an amount of degas, the $O_2$ gas flow rate, the $N_2O$ gas flow rate shown in FIG. 9 are plotted three-dimensionally, relationships shown in FIG. 11 are given. Thus, the optimum range of the P-TEOS film, which does not deteriorate the ferroelectric characteristics of the ferroelectric capacitor, could be confirmed. According to FIG. 11, in the condition of which a ratio of the $N_2O$ gas to a total gas flow rate was set to 20 to 35 flow rate % and also a ratio of the $O_2$ gas to the TEOS gas was set to 200 to 500 flow rate % (2 to 5 times), the conditions in the range indicated by a broken line shown in FIG. 9 could reduce the stress in the P-TEOS film to thus reduce an amount of degas of the P-TEOS film.

By the way, the $N_2$ gas was added in place of the $N_2O$ gas. At that time, when the flow rate of the $N_2$ gas was increased, such a tendency appeared that an amount of degas from the P-TEOS film was reduced, but no change of the stress in the P-TEOS film was found, as indicated by an arrow D in FIG. 9. Therefore, in order to control the stress by incorporating effectively the nitrogen into the P-TEOS film, it is preferable to employ the compound such as $N_2O$ in which N and O are bonded.

Figure 12:
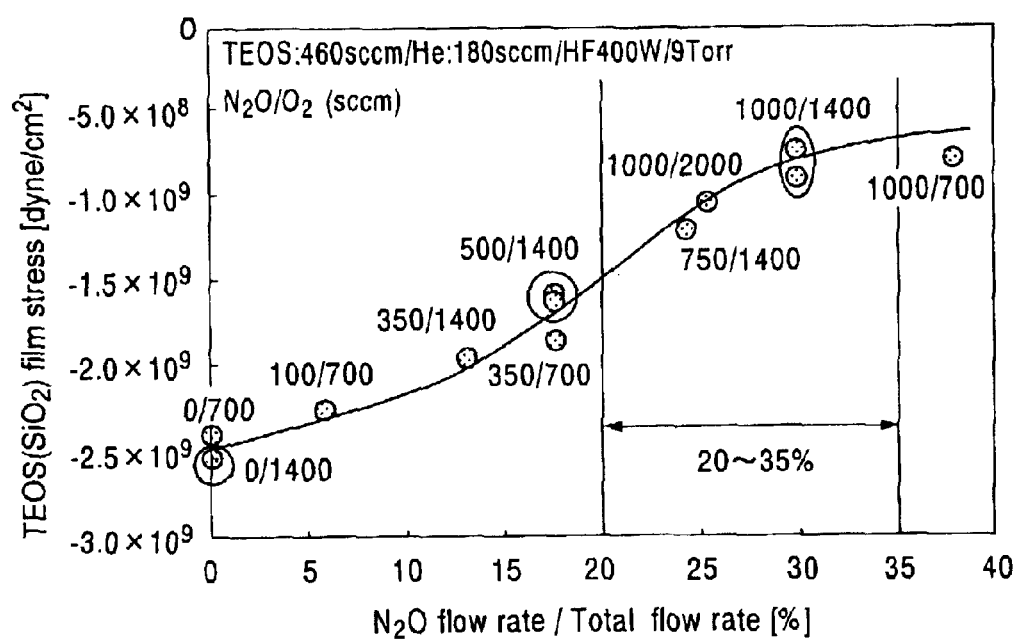
FIG. 12 is a view showing a relationship between an N$_2$O flow rate ratio of the P-TEOS film and a film stress.

Next, when a relationship between a ratio of the flow rate of the $N_2O$ gas to the total flow rate of the gas introduced into the growth atmosphere of the P-TEOS film and the stress in the P-TEOS film are plotted while observing the $N_2O$ gas, results shown in FIG. 12 are derived. It was appreciated that the flow rate ratio of the $N_2O$ gas serves as the parameter of the stress variation. It is possible to control the stress in the P-TEOS film by using the parameter. According to FIG. 12, it was found that 20 to 35 flow rate % is optimum as the flow rate ratio of the $N_2O$ gas that is applied to get the stress and an amount of degas in the range surrounded by a broken line in FIG. 9.

Figure 13:
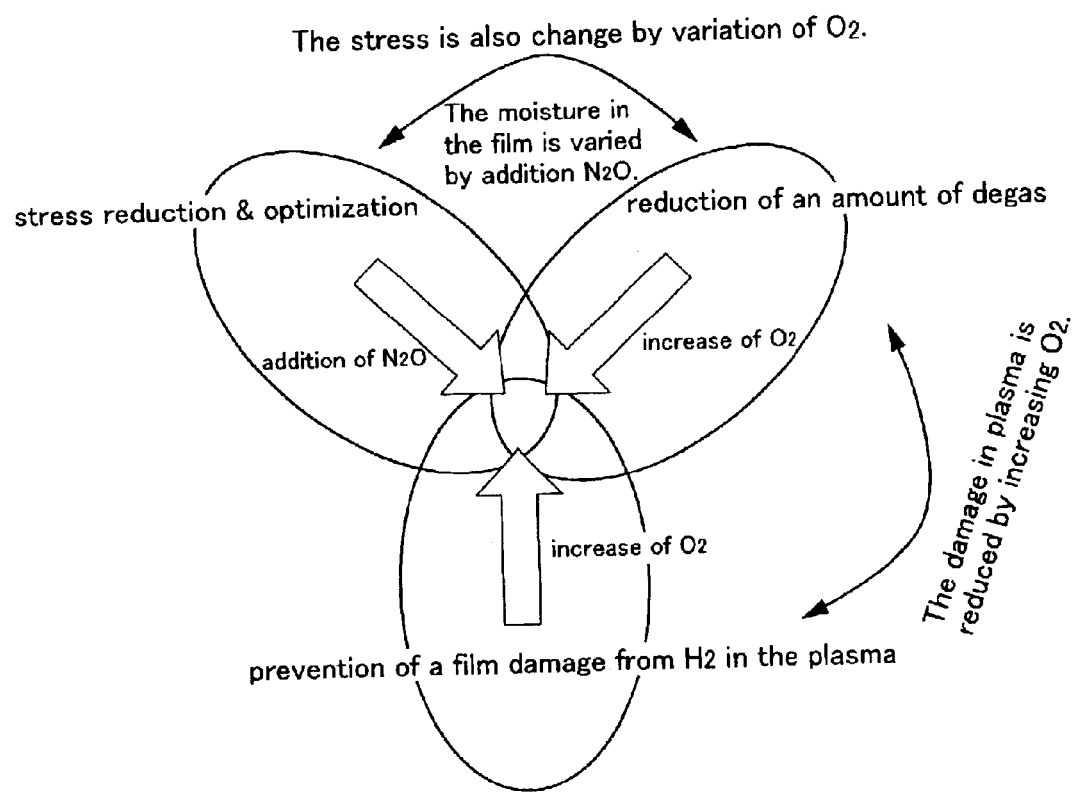
FIG. 13 is a view showing optimization of the P-TEOS film for covering the capacitor.

Relationship shown in FIG. 13 is the conclusion of the experimental results mentioned above. In other words, a center portion of FIG. 13 is the optimum range of the P-TEOS film (interlayer insulating film) that is preferable to the ferroelectric capacitor. The reduction of an amount of degas from the P-TEOS film, the reduction and optimization of the stress in the P-TEOS film, and the increase of the $O_2$ flow rate to reduce the damage of $H_2$ in the plasma must be achieved simultaneously.

Next, improvement in the end deterioration will be explained hereunder.

In compliance with the steps shown in FIGS. 3A to 3J, the first interlayer insulating film 10, the ferroelectric capacitor Q, the conductive plugs 18a to 18c, the capacitor-protection insulating layers 15a, 15b, the second interlayer insulating film 17, the wirings 20a, 20c, 20d and the conductive pad 20b were formed. Then, the switching charge $Q_{SW}$ of the ferroelectric layer 13a constituting the capacitor Q was measured.

In this case, eight neighboring lower electrodes are selected from a plurality of stripe-like lower electrodes 12a that are formed on the first interlayer insulating film 10 in parallel. A plurality of upper electrodes 14a each having a size of 1 μm×1.5 μm are formed at an interval over these lower electrodes 12a. Then, 32 neighboring capacitors that are selected from the capacitors Q each consisting of the upper electrode 14a, the ferroelectric layer 13a, and the lower electrode 12a are evaluated as monitors of 4 rows×8 columns.

In this case, while differentiating the conditions of forming the second interlayer insulating film for covering the capacitors Q, differences of the switching charge $Q_{SW}$ of the capacitors Q were examined. First, as the growth conditions for the second interlayer insulating film, TEOS, $O_2$, and He were introduced into the growth atmosphere at flow rates of 460 sccm, 700 sccm, and 480 sccm respectively as the growth gas, the plasma generating high-frequency power was set to 400 W, and the growth atmosphere was set to 9 Torr. These conditions are the conditions in the prior art.

Also, as the growth conditions of the second interlayer insulating film, in addition to the conditions in the prior art, the conditions of the present invention were employed, i.e., the $N_2O$ gas was introduced into the growth atmosphere at a flow rate of 750 sccm and a flow rate of the $O_2$ gas was increased up to 1400 sccm.

Figure 14:
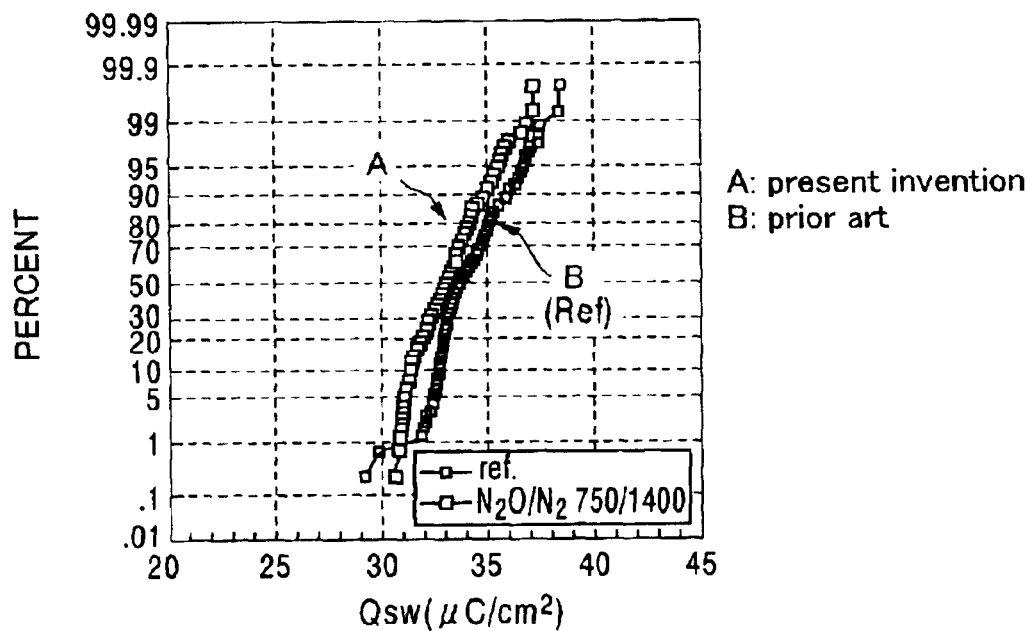
FIG. 14 is a view showing a capacitor switching charge due to differences in interlayer insulating film forming conditions on a monitor in which the end deterioration is not considered.
Figure 15:
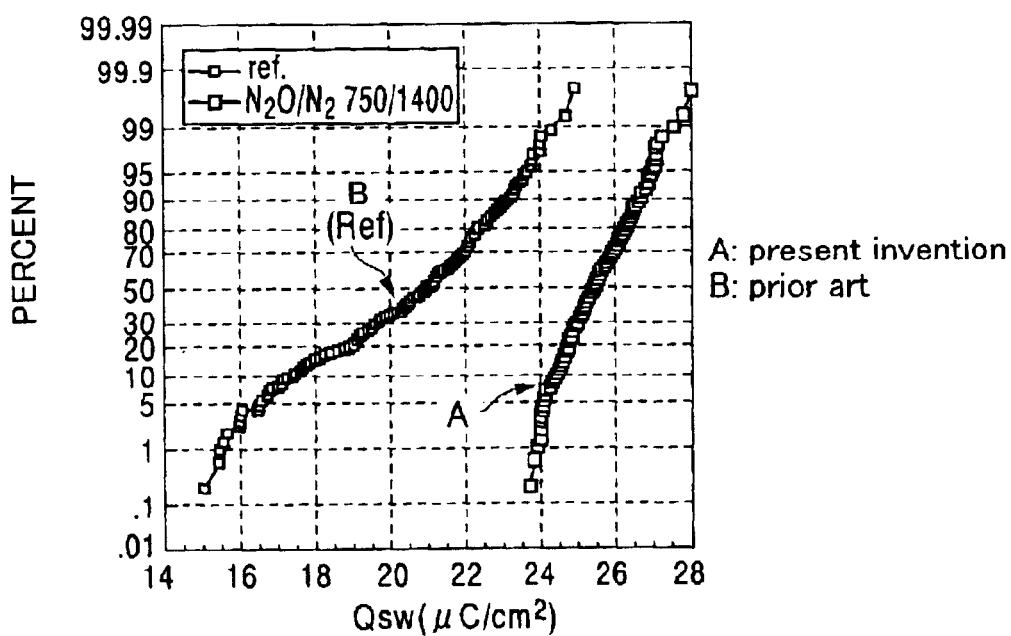
FIG. 15 is a view showing the capacitor switching charge due to differences in interlayer insulating film forming conditions on a monitor in which the end deterioration is considered.

Then, as the result of the examination about how the switching charge $Q_{SW}$ of the monitors should be changed based on the differences in the growth conditions of the second interlayer insulating film, results shown in FIG. 14 and FIG. 15 were obtained.

FIG. 14 shows the switching charges $Q_{SW}$ derived by measuring the 4 rows×8 columns monitors formed in the region near the center of the lower electrode, wherein the end deterioration is not considered. FIG. 15 shows the switching charges $Q_{SW}$ derived by measuring the 4 rows×8 columns monitors formed in vicinity of the contact region (extended region) of the lower electrode, wherein the end deterioration is considered.

According to FIG. 14, it is appreciated that, if the end deterioration is not considered, the characteristics of the ferroelectric capacitor were good in both conditions in the prior art and the present invention. Also, according to FIG. 15, it is appreciated that, when $N_2O$ is added to the growth gas of the P-TEOS film and the flow rate of the $O_2$ gas is increased rather than the conditions in the prior art, like the present invention, the end deterioration was improved largely rather than the prior art.

Therefore, since $N_2O$ is added and the flow rate of the $O_2$ gas is increased rather than the conditions in the prior art, the characteristics of the overall ferroelectric capacitors formed in plural in the memory cell region could be maintained and the end deterioration could be prevented.

Figure 16:
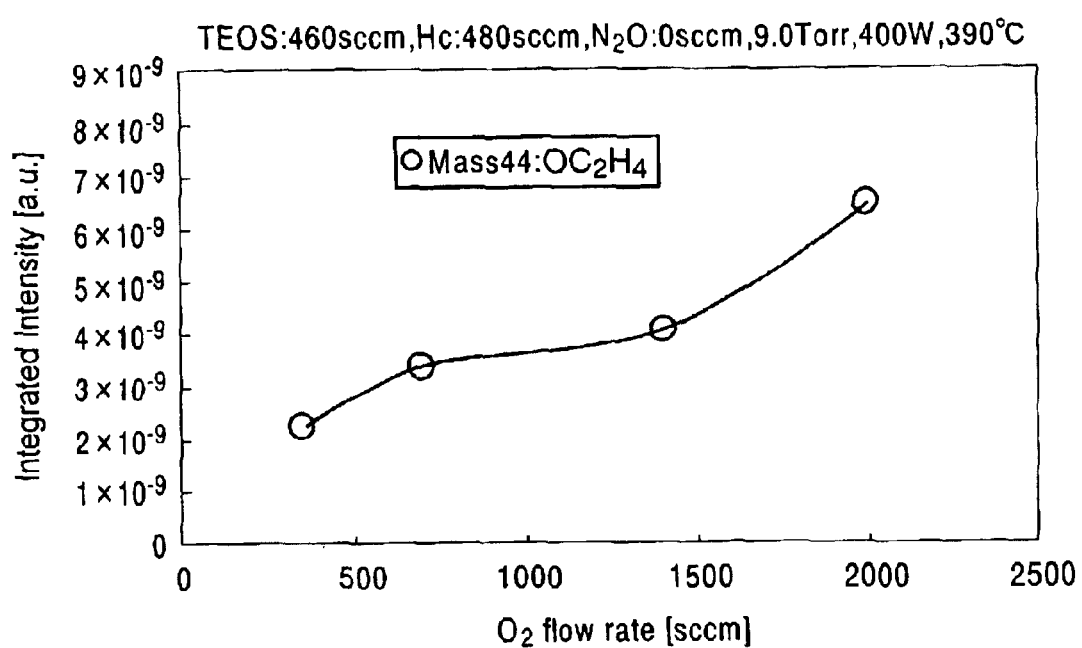
FIG. 16 is a view showing a relationship between an amount of OC$_2$H$_4$ degas in the P-TEOS film and an O$_2$ flow rate ratio.

Meanwhile, according to the present invention, since the silicon oxide film is formed by using the reaction gas containing TEOS, $N_2O$, and $O_2$, the carbon is incorporated into the silicon oxide film, unlike the case that the film is formed by using the silane gas such as $SiH_4$ and the nitrogen gas. As a result, when the silicon oxide film formed by the present invention was measured by TDS, the degas (44) containing the carbon was detected, as shown in FIG. 16. Thus, its film quality is different from the SiON film that is formed by using the silane gas.

In this case, in the above embodiment, the oxygen/nitrogen compound gas that is added into the mixed gas when the P-TEOS film is formed is not limited to $N_2O$. As such oxygen/nitrogen compound gas, at least one of $N_2O$, $NO_2$, and NO may be employed. Also, in the above embodiment, the P-CVD method was employed to grow the P-TEOS film. In addition, the high-density plasma CVD method or the hot-filament CVD method may be employed.

As described above, according to the present invention, when the insulating film is to be formed on the ferroelectric capacitor by using the TEOS gas, $N_2O$ is added to the growth gas and also the $O_2$ gas is increased rather than the prior art. Therefore, local deterioration of a plurality of capacitors can be suppressed and thus the FeRAM having the good ferroelectric characteristic can be formed. As a result, the cell can be used as the wider area by reducing the dummy capacitors that are arranged in the periphery of the capacitor forming region. Therefore, the present invention can respond to the higher integration and the larger capacity, and thus the next generation FeRAM can be implemented.

What is claimed is:

1. A method of manufacturing a semiconductor device, comprising the steps of:

forming a first insulating film over a semiconductor substrate;

forming a capacitor having a lower electrode, a ferroelectric layer, and an upper electrode over the first insulating film; and growing a second insulating film over the first insulating film and the capacitor by using a mixed gas containing a compound gas of oxygen and nitrogen, TEOS, and oxygen.

2. A method of manufacturing a semiconductor device, according to claim 1, wherein the compound gas of oxygen and nitrogen is a gas that contains at least one of $N_2O$, $NO_2$, and NO.

3. A method of manufacturing a semiconductor device, according to claim 1, wherein a ratio of an flow rate of the compound gas to a total flow rate of the mixed gas is set within a range of 20 to 35%.

4. A method of manufacturing a semiconductor device, according to claim 1, wherein a flow rate of the oxygen gas is two times or more a flow rate of the TEOS gas.

5. A method of manufacturing a semiconductor device, according to claim 1, wherein the second insulating film is a silicon oxide film.

6. A method of manufacturing a semiconductor device, according to claim 1, wherein nitrogen is contained in the second insulating film.

7. A method of manufacturing a semiconductor device, according to claim 1, wherein an inert gas is contained in the mixed gas.

8. A method of manufacturing a semiconductor device, according to claim 7, wherein the inert gas is a carrier gas of the TEOS.

9. A method of manufacturing a semiconductor device, according to claim 1, wherein the second insulating film is formed by one of a plasma CVD method, a high-density plasma CVD method, or a hot-filament CVD method.

10. A method of manufacturing a semiconductor device, according to claim 1, wherein the second insulating film has a compressive stress of $1.5 \times 10^9$ dyne/cm$^2$ to $5.0 \times 10^8$ dyne/cm$^2$.

11. A method of manufacturing a semiconductor device, according to claim 1, wherein various processes applied after the second insulating film is formed are carried out at a substrate temperature of 600° C. or less.

12. A method of manufacturing a semiconductor device, according to claim 1, wherein the lower electrode of the capacitor is formed of a noble metal layer.

13. A method of manufacturing a semiconductor device, according to claim 1, wherein the capacitor is formed in plural at an interval on the first insulating film, and respective lower electrodes constituting a plurality of capacitors are connected mutually.

14. A method of manufacturing a semiconductor device, according to claim 1, wherein an extended portion that is not covered with the ferroelectric layer is provided to an end of the lower electrode.

15. A method of manufacturing a semiconductor device, according to claim 1, further comprising the step of forming a capacitor-protection insulating film between the capacitor and the second insulating film.

16. A method of manufacturing a semiconductor device, according to claim 15, wherein the capacitor-protection insulating film is formed of one of aluminum oxide, PZT material, and titanium oxide.

17. A method of manufacturing a semiconductor device, according to claim 15, wherein the capacitor-protection insulating film is formed on the capacitor in plural times.

18. A method of manufacturing a semiconductor device, according to claim 17, wherein the capacitor-protection insulating film is formed of one of aluminum oxide, PZT material, and titanium oxide.

19. A method of manufacturing a semiconductor device, according to claim 1, further comprising the steps of:

forming a first hole on a contact region of the lower electrode, which does not overlap with the upper electrode and the ferroelectric layer, by patterning the second insulating layer;

forming a second hole over the upper electrode by patterning the second insulating layer; and forming a first wiring, which is connected electrically to the lower electrode via the first hole, and a second wiring, which is connected electrically to the upper electrode via the second hole, over the second insulating layer respectively.

* * * * *